(12) United States Patent
Imanaka

(10) Patent No.: US 9,621,137 B2
(45) Date of Patent: Apr. 11, 2017

(54) AMPLITUDE NORMALIZATION CIRCUIT, POWER SUPPLY AND ELECTRONIC APPARATUS

(71) Applicant: ROHM CO., LTD., Ukyo-ku, Kyoto (JP)

(72) Inventor: Yoshinori Imanaka, Kyoto (JP)

(*) Notice: Subject to any disclaimer, the term of this patent is extended or adjusted under 35 U.S.C. 154(b) by 144 days.

(21) Appl. No.: 14/582,387

(22) Filed: Dec. 24, 2014

(65) Prior Publication Data

US 2015/0188412 A1 Jul. 2, 2015

(30) Foreign Application Priority Data

Dec. 27, 2013 (JP) ................. 2013-271022

(51) Int. Cl.
| | |
|---|---|
| H02M 1/42 | (2007.01) |
| H03K 3/017 | (2006.01) |
| H03K 4/06 | (2006.01) |
| H02M 7/06 | (2006.01) |
| H05B 33/08 | (2006.01) |

(52) U.S. Cl.
CPC ............ H03K 4/06 (2013.01); H02M 1/4225 (2013.01); H05B 33/0815 (2013.01); H03K 3/017 (2013.01); Y02B 20/346 (2013.01); Y02B 70/126 (2013.01)

(58) Field of Classification Search
USPC ............ 315/200 R, 224, 247, 291, 297, 307; 323/205, 265, 271, 282, 284; 327/291, 327/293, 294, 298, 299
See application file for complete search history.

(56) References Cited

U.S. PATENT DOCUMENTS

| | | | |
|---|---|---|---|
| 9,049,760 B2* | 6/2015 | Wang | H05B 33/0809 |
| 2012/0299570 A1* | 11/2012 | Hung | H02M 1/4208 |
| | | | 323/284 |
| 2014/0091774 A1* | 4/2014 | Srinivasan | G05F 1/468 |
| | | | 323/271 |

FOREIGN PATENT DOCUMENTS

JP 2012-249508 A 12/2012

\* cited by examiner

*Primary Examiner* — Thai Pham
(74) *Attorney, Agent, or Firm* — Cantor Colburn LLP

(57) ABSTRACT

An amplitude normalization circuit includes: a peak detector that detects a peak value of a full-wave rectified voltage of an AC voltage; a triangular wave oscillator connected to the peak detector generates a triangular wave voltage having the peak value; a comparator connected to the triangular oscillator compares the triangular wave voltage with the full-wave rectified voltage and outputs a pulse width modulation signal; and a waveform converter connected to the comparator converts a waveform of the pulse width modulation signal and outputs an output voltage with constant amplitude.

18 Claims, 16 Drawing Sheets

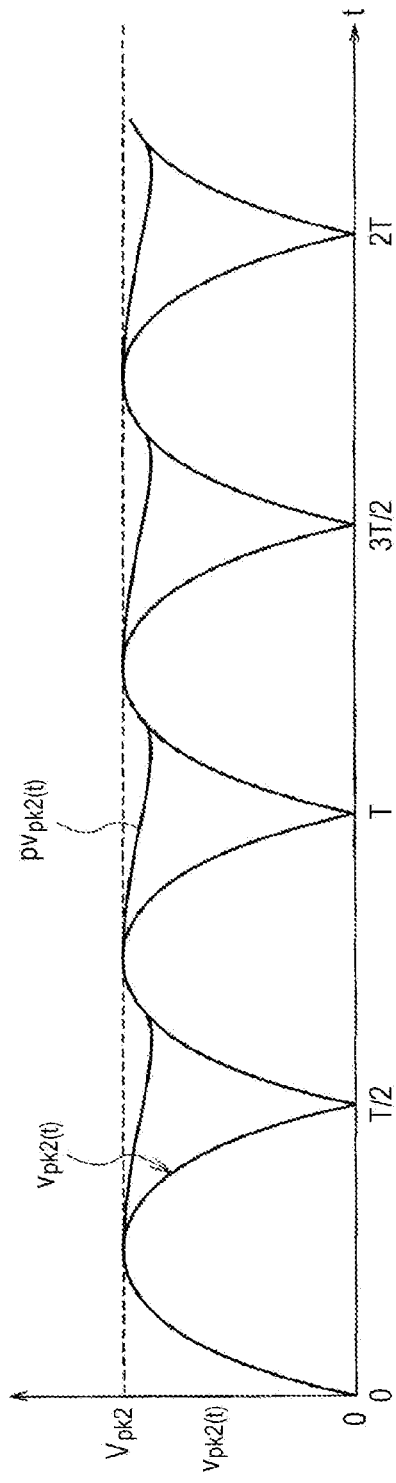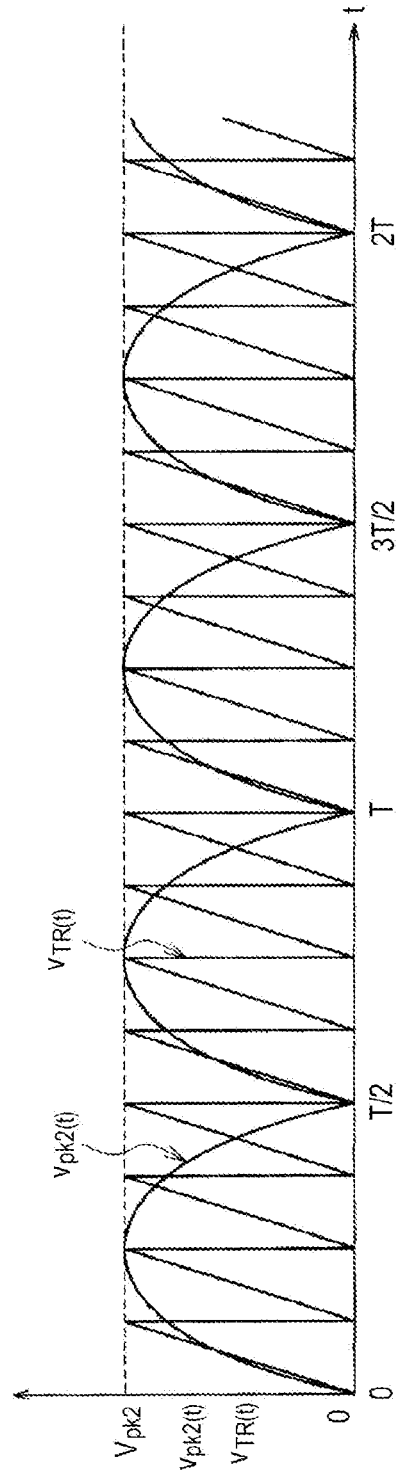

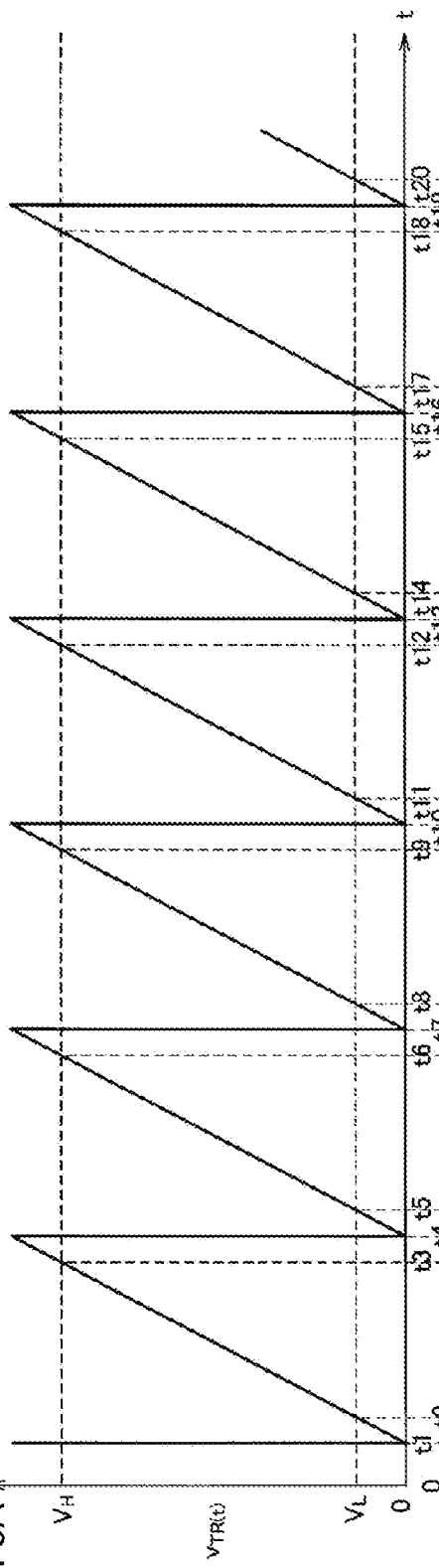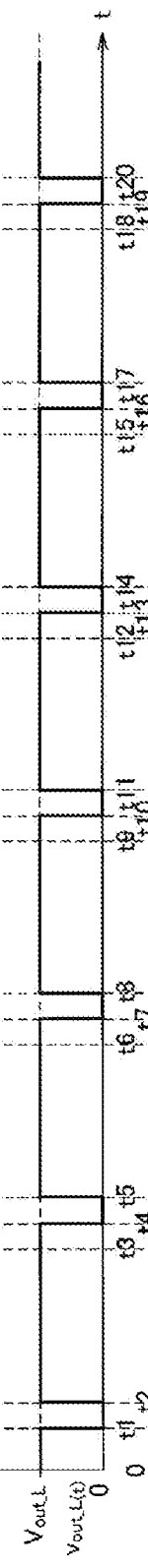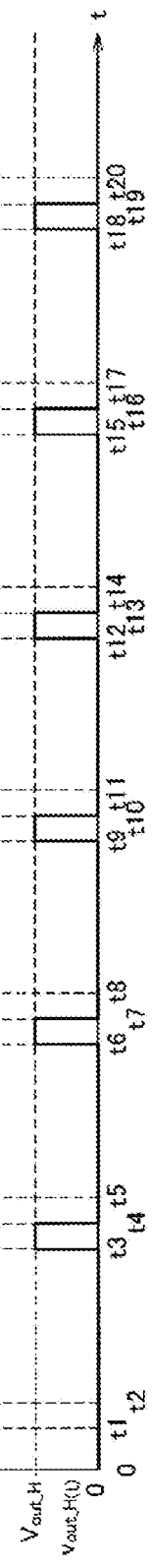

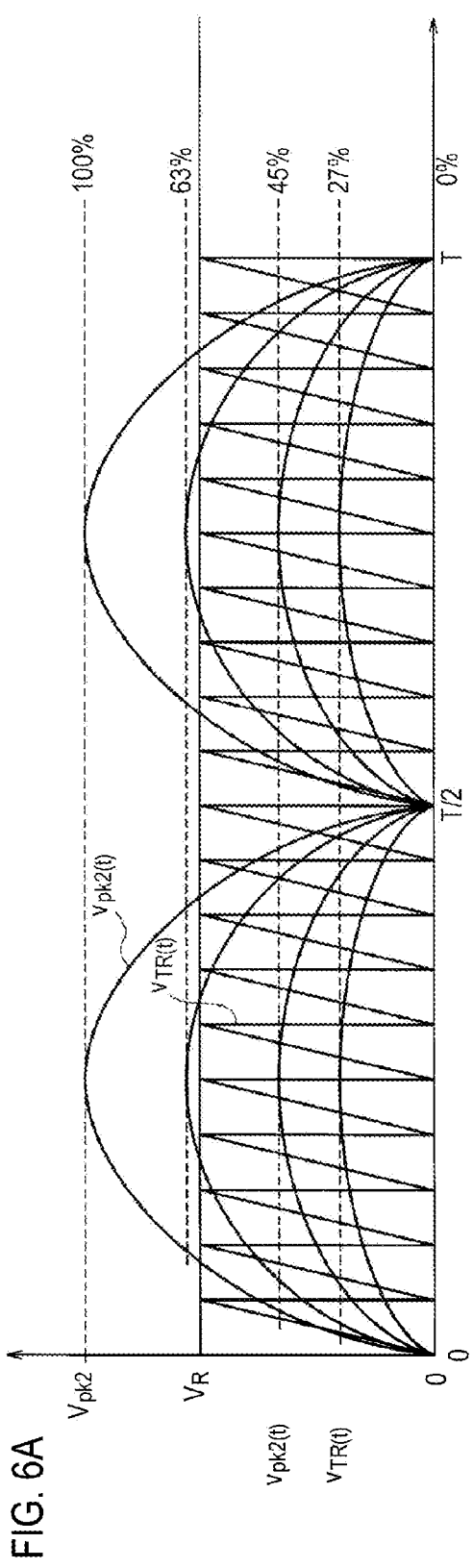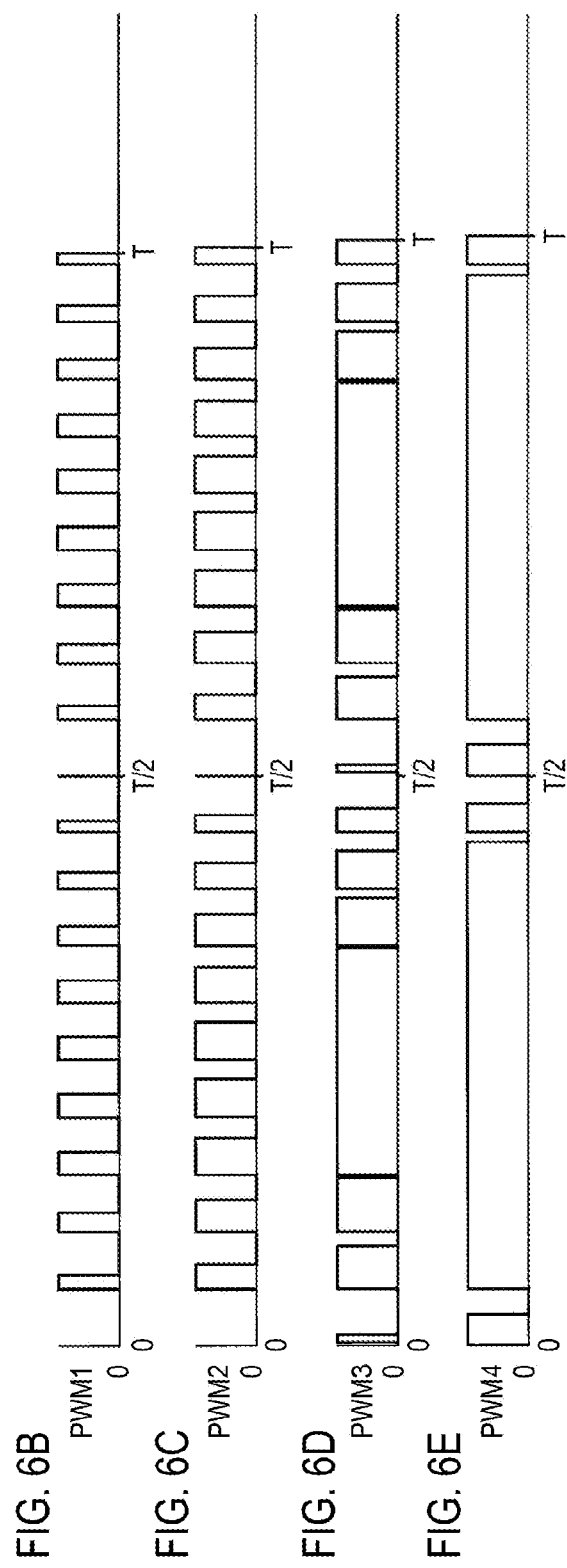

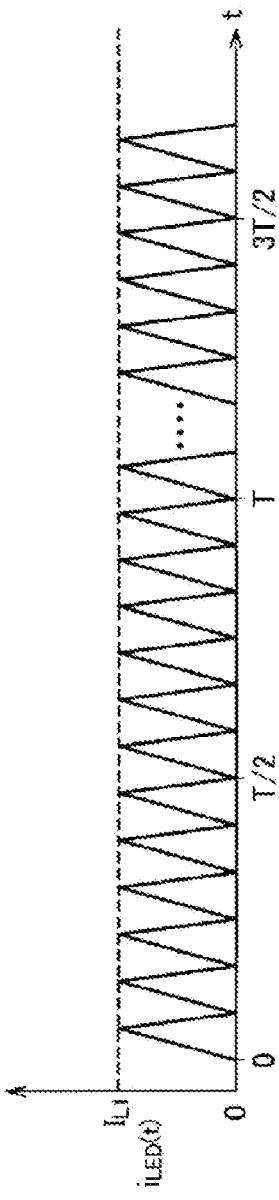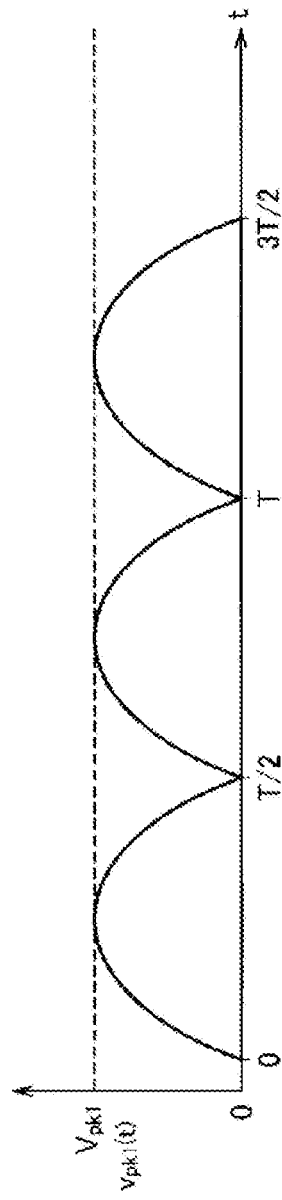
FIG. 9A
FIG. 9B

AMPLITUDE NORMALIZATION CIRCUIT, POWER SUPPLY AND ELECTRONIC APPARATUS

CROSS-REFERENCE TO RELATED APPLICATION

This application is based upon and claims the benefit of priority from Japanese Patent Application No. 2013-271022, filed on Dec. 27, 2013, the entire contents of which are incorporated herein by reference.

TECHNICAL FIELD

The present disclosure relates to an amplitude normalization circuit capable of providing waveform reproducibility, regardless of the amplitude of an input voltage waveform, and also relates to a power supply and an electronic apparatus including the amplitude normalization circuit.

BACKGROUND

An amplitude normalization circuit may be used for a power supply with a PFC (Power Factor Correction) function in the related art.

In conventional amplitude normalization circuits, in order to generate a "waveform" having a constant amplitude, an input waveform is digitized by an A/D converter, amplitude-normalized by a digital arithmetic circuit, and then converted back into analog form by a D/A converter.

On this account, the circuit size of conventional amplitude normalization circuits is increased due to the D/A converter, the A/D converter and the complicated digital arithmetic circuit. In addition, since the generated waveform depends on the resolutions of the D/A converter and the A/D converter, there is a limitation in the reproducibility of the "waveform".

SUMMARY

The present disclosure provides some embodiments of an amplitude normalization circuit with a simple configuration that is capable of providing good reproducibility of an input voltage waveform having a constant amplitude, regardless of the amplitude of an input voltage waveform. Some of the embodiments are directed to a power supply and an electronic apparatus including the amplitude normalization circuit to provide improved line regulation (input power supply voltage characteristics).

According to an aspect of the present disclosure, there is provided an amplitude normalization circuit including: a peak detector that detects a peak value of a full-wave rectified voltage of an AC voltage; a triangular wave oscillator connected to the peak detector and configured to generate a triangular wave voltage having a peak derived from the peak value of the full-wave rectified voltage; a comparator connected to the triangular oscillator and configured to compare the triangular wave voltage with the full-wave rectified voltage and output a pulse width modulation signal; and a waveform converter connected to the comparator and configured to convert a waveform of the pulse width modulation signal and output an output voltage with a constant amplitude.

According to another aspect of the present disclosure, there is provided a power supply including the above-described amplitude normalization circuit.

According to still another aspect of the present disclosure, there is provided an electronic apparatus including the above-described power supply.

BRIEF DESCRIPTION OF THE DRAWINGS

FIGS. 4A and 4B are operational waveform diagrams of an amplitude normalization circuit, according to some embodiments. FIG. 4A shows a waveform of a full-wave rectified voltage $v_{pk2}(t)$ obtained when a full-wave rectified voltage $v_{pk1}(t)$ in a diode bridge (DB) output is attenuated, and a peak detected voltage $pv_{pk2}(t)$ of the full-wave rectified voltage $v_{pk2}(t)$. FIG. 4B shows the waveform of the full-wave rectified voltage $v_{pk2}(t)$ and a triangular wave voltage $v_{TR}(t)$ that are inputs to a PWM comparator.

FIGS. 5A to 5C are operational waveform diagrams of the amplitude normalization circuit, according to some embodiments. FIG. 5A shows a waveform of the triangular wave voltage $v_{TR}(t)$, inputted to the PWM comparator, indicating a high level constant voltage $V_H$ and a low level constant voltage $V_L$. FIG. 5B shows an example of a waveform of a PWM comparator output voltage $v_{out\_L}(t)$ in case of the comparison of the triangular wave voltage $v_{TR}(t)$ with the low level constant voltage $V_L$ and FIG. 5C shows an example of a waveform of a PWM comparator output voltage $v_{outH}(t)$ in case of the comparison of the triangular wave voltage $v_{TR}(t)$ with the high level constant voltage $V_H$.

FIGS. 6A to 6E are operational waveform diagrams of the amplitude normalization circuit, according to some other embodiments. FIG. 6A shows waveforms resulting from the comparison of each of the full-wave rectified voltage $v_{pk2}(t)$ respectively having amplitude of 100%, 63%, 45% or 27% of the peak value $V_{pk2}$ with the triangular wave voltage $v_{TR}(t)$. FIG. 6B shows an example of a PWM comparator output voltage waveform (PWM1) in case of the comparison of the full-wave rectified voltage $0.27v_{pk2}(t)$ having amplitude of 27% of the peak value $V_{pk2}$ with the triangular wave voltage $v_{TR}(t)$. FIG. 6C shows an example of a PWM comparator output voltage waveform (PWM2) in case of the comparison of the full-wave rectified voltage $0.45v_{pk2}(t)$ having amplitude of 45% of the peak value $V_{pk2}$ with the triangular wave voltage $v_{TR}(t)$. FIG. 6D shows an example of a PWM comparator output voltage waveform (PWM3) in case of the comparison of the full-wave rectified voltage $0.63v_{pk2}(t)$ having amplitude of 63% of the peak value $V_{pk2}$ with the triangular wave voltage $v_{TR}(t)$. FIG. 6E shows an example of a PWM comparator output voltage waveform (PWM4) in case of the comparison of the full-wave rectified voltage $v_{pk2}(t)$ having amplitude of 100% of the peak value $V_{pk2}$ with the triangular wave voltage $v_{TR}(t)$.

FIG. 8A shows an exemplary waveform of a gate voltage $v_G(t)$, FIG. 8B shows an exemplary waveform of the current sense voltage $v_{CS}(t)$, and FIG. 8C shows an exemplary waveform of LED conduction current $i_{LED}(t)$.

FIGS. 9A and 9B are additional operational waveform diagrams of the comparative example power supply. FIG. 9A shows an exemplary waveform of the LED conduction current $i_{LED}(t)$ and FIG. 9B shows an exemplary waveform of the full-wave rectified voltage $v_{pk1}(t)$ in the output of the diode bridge (DB).

FIG. 11A shows a waveform of a gate voltage $v_G(t)$ (PWM). FIG. 11B shows waveforms of the AC voltage $v_{in}(t)$ (with high level H and low level L). FIG. 11C shows waveforms of a current sense voltage $v_{CS}(t)$ corresponding to the exemplary waveforms of the AC voltage $v_{in}(t)$ (with high level H and low level L; and where the peak value of the waveform of the current sense voltage $v_{CS}(t)$ corresponding to the waveform of the AC voltage $v_{in}(t)$ with high level H is $V_{DD}$). FIG. 11D shows waveforms of a LED conduction current $i_{LED}(t)$ (with high level H and low level L).

FIG. 13A shows an exemplary waveform of AC voltage $v_{in}(t)$, FIG. 13B shows an exemplary waveform of full-wave rectified voltage $v_{pk1}(t)$ in a diode bridge (DB) output, and FIG. 13C shows an exemplary waveform of LED conduction current $i_{LED}(t)$ (a dotted envelope is in phase with $v_{pk1}(0)$.

DETAILED DESCRIPTION

Figure 1:
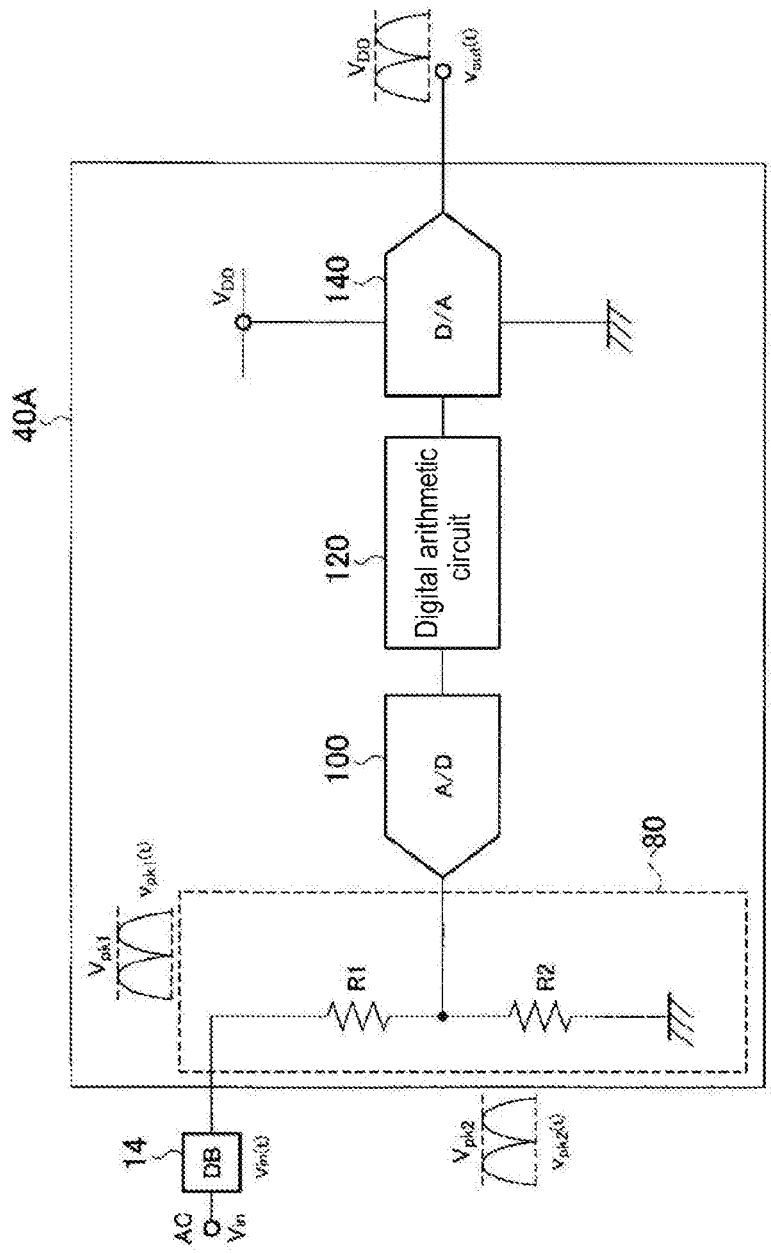
FIG. 1 is a circuit block diagram of a comparative example of an amplitude normalization circuit.

Embodiments of the present disclosure will now be described in detail with reference to the drawings. For each drawing, the same or similar elements are denoted by the same or similar reference numerals. However, it should be noted that each drawing is merely a schematic, and relationships of thicknesses and planar dimensions of elements may be different from actual implementations. Accordingly, specific thicknesses and dimensions should be determined in consideration of the following description. In addition, it is to be understood that different drawings may include different dimensional relationships and ratios.

The following embodiments are provided to illustrate devices and methods that embody the technical ideas of the present disclosure. Embodiments of the present disclosure are not limited to materials, forms, structures, arrangements and so on of elements detailed herein. The embodiments of the present disclosure may be modified in different ways without departing from the spirit and scope of the invention defined by the claims.

In the following description, a time-varying waveform is denoted by a small letter and an amplitude value corresponding to its peak value is denoted by a capital letter. For example, a full-wave rectified voltage of an output of a diode bridge (DB) 14 is denoted by $v_{pk1}(t)$ and an amplitude value corresponding to its peak value is denoted by a voltage $V_{pk1}$ in capital. The same applies throughout the specification and the drawings.

Amplitude Normalization Circuit

Comparative Example

FIG. 1 shows a circuit block diagram of a comparative example of an amplitude normalization circuit 40A.

Referring to FIG. 1, the comparative example of the amplitude normalization circuit 40A includes a diode bridge (DB) 14 for full-wave rectifying an AC voltage $v_{in}(t)$ to obtain a full-wave rectified voltage $v_{pk1}(t)$, an attenuator 80 for dividing the full-wave rectified voltage $v_{pk1}(t)$ by resistors R1 and R2 and attenuating it to a full-wave rectified voltage $v_{pk2}(t)$, an A/D converter 100 for converting analog data of the full-wave rectified voltage $v_{pk2}(t)$ into digital data, a digital arithmetic circuit 120 for digitally processing the digital data from the A/D converter 100, and a D/A converter 140 for converting the digitally-processed digital data from the digital arithmetic circuit 120 into analog data to be output as an output voltage $v_{out}(t)$ having an amplitude voltage $V_{DD}$. Here, the amplitude of the output voltage $v_{out}(t)$ is fixed at the amplitude voltage $V_{DD}$ without depending on the full-wave rectified voltage $v_{pk2}(t)$.

As shown in FIG. 1, the attenuator 80 may be configured with a series circuit of resistors R1 and R2 and can attenuate the full-wave rectified voltage $v_{pk1}(t)$, which is obtained by full-wave rectifying the AC voltage $v_{in}(t)$, through resistance division of the resistors R1 and R2.

In the amplitude normalization circuit 40A according to the comparative example, in order to make the amplitude voltage $V_{DD}$ constant and generate a "waveform" of the full-wave rectified voltage $v_{pk1}(t)$ of the AC voltage $v_{in}(t)$, the analog data of the full-wave rectified voltage $v_{pk2}(t)$ is digitized by the A/D converter 100, a waveform of the digitized full-wave rectified voltage $v_{pk2}(t)$ is amplitude-normalized by the digital arithmetic circuit 120, and the amplitude-normalized waveform is converted back into analog data by the D/A converter 140, as shown in FIG. 1.

However, in the amplitude normalization circuit 40A according to the comparative example, the circuit scale is increased due to the D/A converter 140, the A/D converter 100 and the complicated digital arithmetic circuit 120. In addition, since the generated waveform depends on the resolutions of the D/A converter 140 and the A/D converter 100, there is a limitation in the reproducibility of the "waveform."

Embodiments

Figure 2:
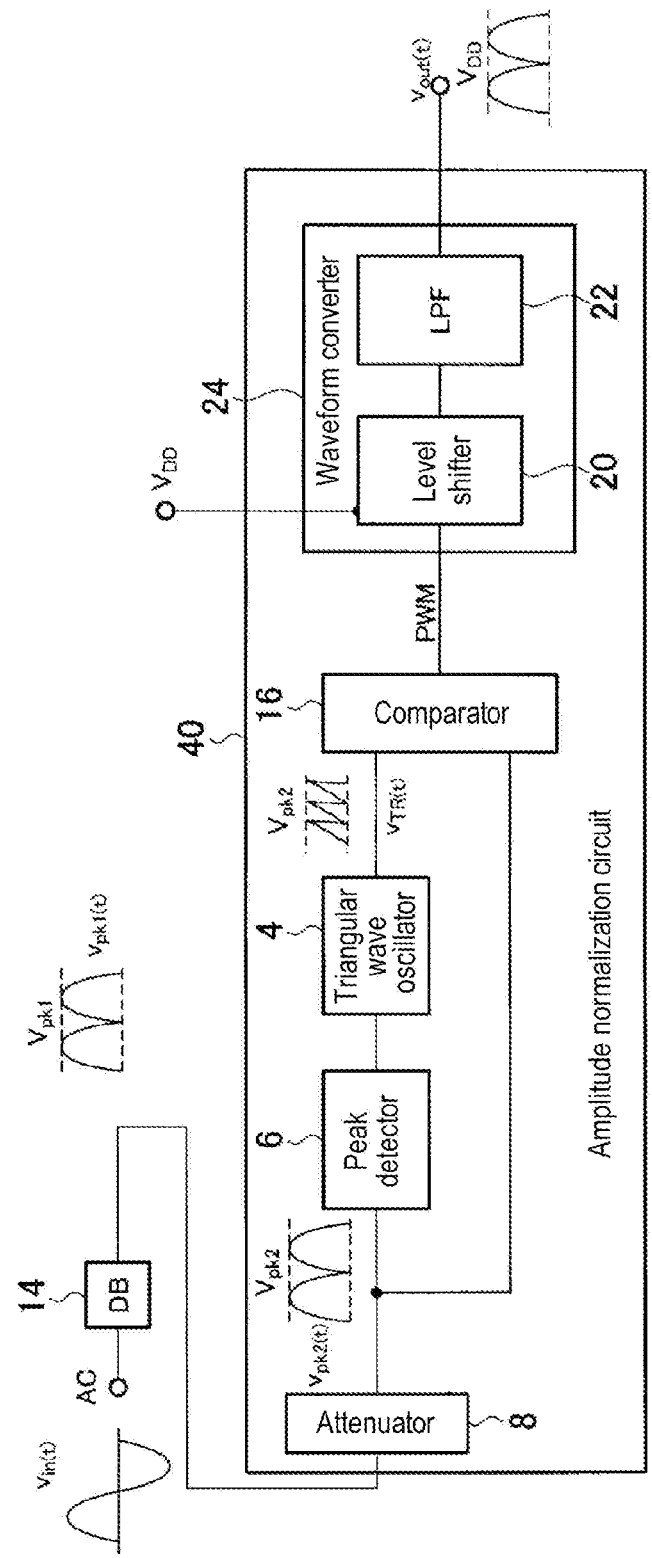
FIG. 2 is a block diagram of an amplitude normalization circuit according to some embodiments.
Figure 3:
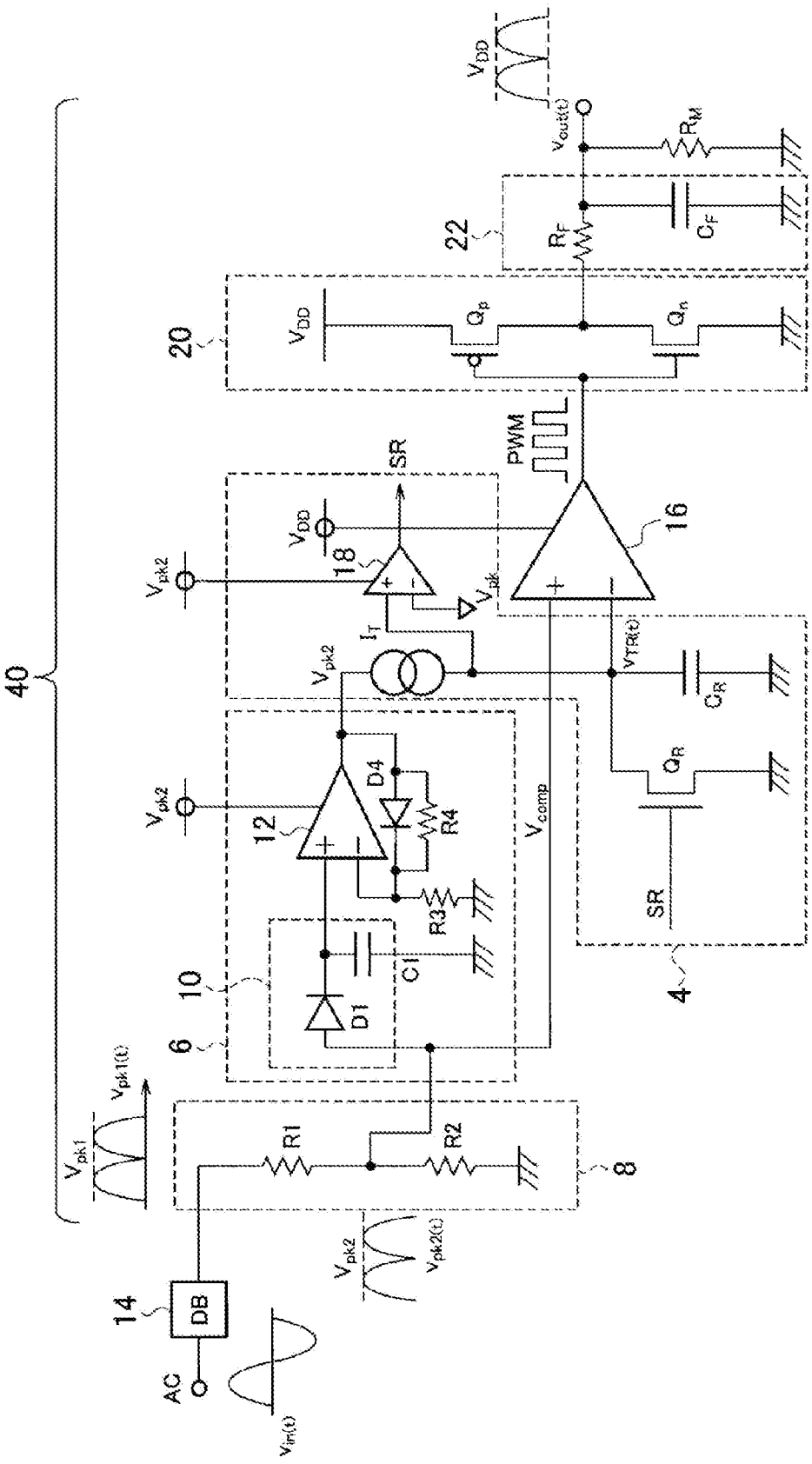
FIG. 3 is a detailed schematic circuit diagram of an amplitude normalization circuit according to some embodiments.

FIG. 2 is a block diagram of an amplitude normalization circuit 40, according to some embodiments. FIG. 3 is a detailed circuit diagram of the amplitude normalization circuit 40 of FIG. 2, according to some embodiments.

Referring to FIG. 2, the amplitude normalization circuit 40 includes an attenuator 8 for attenuating a full-wave rectified voltage $v_{pk1}(t)$ to a full-wave rectified voltage $v_{pk2}(t)$, a peak detector 6 for detecting a peak value $V_{pk2}$ of the full-wave rectified voltage $v_{pk2}(t)$ outputted from the attenuator 8, and a pulse width modulation (PWM) converting means 4 and 16 for converting level values corresponding percentages of the full-wave rectified voltage $v_{pk2}(t)$ with respect to the peak value $V_{pk2}$ into a PWM signal. The amplitude normalization circuit 40 generates a waveform of the full-wave rectified voltage $v_{pk2}(t)$ with the constant amplitude $V_{DD}$, regardless of the amplitude $V_{pk2}$ of the full-wave rectified voltage $v_{pk2}(t)$, by filtering the PWM signal. Here, the amplitude value $V_{DD}$ of the output voltage $v_{out}(t)$ is fixed, regardless of the amplitude value $V_{pk1}$ of the full-wave rectified voltage $v_{pk1}(t)$.

As shown in FIG. 2, the PWM converting means 4 and 16 may include a triangular wave oscillator 4 for generating a triangular wave voltage $v_{TR}(t)$ having a peak value of $V_{pk2}$ and a comparator 16 connected to the triangular wave oscillator 4 and to the attenuator 8 for comparing the full-wave rectified voltage $v_{pk2}(t)$ with the triangular wave voltage $v_{TR}(t)$ and outputting the PWM signal.

In addition, as shown in FIG. 2, the amplitude normalization circuit 40 may include a waveform converter 24 connected to the comparator 16 for converting a waveform of the PWM signal and outputting the output voltage $v_{out}(t)$ having the constant amplitude $V_{DD}$.

To summarize the above, as shown in FIG. 2, the amplitude normalization circuit 40 includes the attenuator 8 for receiving the full-wave rectified voltage $v_{pk1}(t)$ of the AC voltage $v_{in}(t)$, and the peak detector 6 connected to the attenuator 8 for detecting the peak value $V_{pk2}$ of the full-wave rectified voltage $v_{pk2}(t)$ attenuated and outputted from the attenuator 8. The amplitude normalization circuit 40 also includes the triangular wave oscillator 4 connected to the peak detector 6, which generates the triangular wave voltage $v_{TR}(t)$ having a peak value $V_{pk2}$. The amplitude normalization circuit 40 further includes the comparator 16 connected to the triangular wave oscillator 4 and the attenuator 8, which compares the full-wave rectified voltage $v_{pk2}(t)$ and the triangular wave voltage $v_{TR}(t)$ and outputs the PWM signal, and the waveform converter 24 that converts the waveform of the PWM signal and outputs the output voltage $v_{out}(t)$ having a constant amplitude $V_{DD}$.

In addition, as shown in FIG. 2, the waveform converter 24 in the amplitude normalization circuit 40 may include a level shifter 20 for shifting a level of the PWM signal, and a low pass filter (LPF) 22 connected to the level shifter 20 for filtering the level-shifted PWM signal.

In addition, as shown in FIG. 3, the peak detector 6 in the amplitude normalization circuit 40 may include a peak detecting part 10 and a buffer 12. The peak detecting part 10 includes a diode D1 having an anode connected to the attenuator 8, and a capacitor C1 connected in series between a cathode of the diode D1 and a ground potential. The buffer 12 is connected to a node between the diode D1 and the capacitor C1 of the peak detecting part 10 and outputs a voltage that is equal to the peak value $V_{pk2}$.

Here, as shown in FIG. 3, the attenuator 8 may be configured with a series circuit of resistors R1 and R2 and can attenuate the full-wave rectified voltage $v_{pk1}(t)$, which is obtained by full-wave rectifying the AC voltage $v_{in}(t)$, to the full-wave rectified voltage $v_{pk2}(t)$ by dividing the voltage via the resistors R1 and R2. That is, the anode of the diode D1 is connected to a node between the resistors R1 and R2.

In addition, an operating power source voltage of the buffer 12 may be set to be equal to the voltage $V_{pk2}$. A positive input terminal of the buffer 12 is connected to the node between the diode D1 and the capacitor C1. A parallel circuit of a diode D4 and a resistor R4 is connected between a negative input terminal and an output terminal of the buffer 12. A resistor R3 is connected between the negative input terminal of the buffer 12 and the ground potential.

In addition, as shown in FIG. 3, the triangular wave oscillator 4 in the amplitude normalization circuit 40 may include a current source $I_T$ connected to the peak detector 6, a reset capacitor $C_R$ connected in series between the current source $I_T$ and the ground potential, a reset comparator 18 connected to the current source $I_T$ for outputting a reset signal SR, and a reset MOS transistor $Q_R$ that is connected in parallel to the reset capacitor $C_R$ and turned on/off based on the reset signal SR. Here, the triangular wave oscillator 4 can generate the triangular wave voltage $v_{TR}(t)$ having the same frequency as a sampling frequency $f_s$ of a PWM control.

An operation power source voltage of the reset comparator 18 may be set to be equal to the voltage $V_{pk2}$. A voltage (which is equal to the triangular wave voltage $v_{TR}(t)$) of the reset capacitor $C_R$ is input to the positive input terminal of the reset comparator 18 and a reference voltage $V_{pk}$ is input to the negative input terminal thereof. If the voltage of the reset capacitor $C_R$ exceeds the reference voltage $V_{pk}$, the reset signal SR is outputted from the reset comparator 18 to turn on the reset MOS transistor $Q_R$, thereby discharging the reset capacitor $C_R$ such that the triangular wave voltage $v_{TR}(t)$ reaches 0V. Since the reset capacitor $C_R$ is always charged with a constant current from the current source $I_T$, a voltage across the reset capacitor $C_R$ is again increased. When the voltage of the reset capacitor $C_R$ exceeds the reference voltage $V_{pk}$, the reset signal SR is outputted from the reset comparator 18 and the above-described operation is repeated.

As shown in FIG. 3, the comparator 16 may include a PWM comparator that has a positive input terminal to which the full-wave rectified voltage $v_{pk2}(t)$ is input and a negative input terminal to which the triangular wave voltage $v_{TR}(t)$ is input, and that compares the full-wave rectified voltage $v_{pk2}(t)$ with the triangular wave voltage $v_{TR}(t)$ to output the PWM signal having the constant amplitude value $V_{DD}$.

As shown in FIG. 3, the level shifter 20 may include a CMOS circuit including a p-channel MOS transistor $Q_p$ having a source connected to a power source voltage $V_{DD}$, which is equal to the constant amplitude value $V_{DD}$, and an n-channel MOS transistor $Q_n$ having a source connected to a ground potential, both of which are connected in series between the power source voltage $V_{DD}$ and the ground potential. Here, a level-shifted PWM signal can be output at a node between a drain of the p-channel MOS transistor $Q_p$ and a drain of the n-channel MOS transistor $Q_n$.

The LPF 22 may include a filter resistor $R_F$ and a filter capacitor $C_F$ which are connected in series between the ground potential and an output terminal of the CMOS circuit ($Q_p$ and $Q_n$) of the level shifter 20. A high impedance resistor $R_M$ may be connected in parallel to the filter capacitor $C_F$. Resistance of the resistor $R_M$ may be about 2 MΩ.

It is desirable that the PWM sampling frequency $f_s$ is higher by three or more orders of magnitude than a frequency of the AC voltage $v_{in}(t)$. For example, when a frequency of the AC voltage $v_{in}(t)$ is 50 Hz and a frequency of each of the full-wave rectified voltage $v_{pk1}(t)$ and the full-wave rectified voltage $v_{pk2}(t)$ is 100 Hz, the PMW sampling frequency $f_s$ of about 200 kHz to about 500 kHz may be used. An oscillation frequency of the triangular wave oscillator 4 generating the triangular wave voltage $v_{TR}(t)$ may be, for example, about 200 kHz to about 500 kHz, which is equal to the PWM sampling frequency $f_s$.

The amplitude value $V_{pk2}$ of the full-wave rectified voltage $v_{pk2}(t)$ may be greater than the constant amplitude value $V_{DD}$. The amplitude value $V_{pk2}$ may be about 4 V and the amplitude value $V_{DD}$ may be about 2V.

An attenuation factor of the attenuator 8 may be set to be equal to 1.

In the amplitude normalization circuit 40, the output voltage $v_{out}(t)$ having the amplitude fixed at the amplitude voltage $V_{DD}$, without depending on the peak value $V_{pk2}$, and the waveform thereof can be generated. In particular, even when the amplitude of the full-wave rectified voltage $v_{pk2}(t)$ inputted to the comparator 16 is small, the comparator 16 can output a following PWM signal having a small pulse width. Conversely, even when the amplitude of the full-wave rectified voltage $v_{pk2}(t)$ inputted to the comparator 16 is large, the comparator 16 can output a following PWM signal having a large pulse width.

That is, in the amplitude normalization circuit 40, the amplitude of the output voltage $v_{out}(t)$ is fixed at the amplitude voltage $V_{DD}$ without depending on the peak value $V_{pk2}$. In addition, even if the amplitude of the full-wave rectified voltage $v_{pk2}(t)$ is changed from 0% to 100%, the amplitude-normalized output voltage $v_{out}(t)$ can be generated. Waveform reproducibility of the output voltage $v_{out}(t)$ depends on waveform reproduction performance of the comparator 16. Thus, the PWM sampling frequency fs may be higher than the frequency of the AC voltage $v_{in}(t)$.

In the amplitude normalization circuit 40, even if the amplitude of the full-wave rectified voltage $v_{pk2}(t)$ is changed from 0% to 100%, for example, from 0V to 100V, the full-wave rectified voltage having the normalized amplitude value $V_{DD}$=1V may be obtained as the output voltage $v_{out}(t)$. Further, with passage through the LPF 22, the more constant voltage of the amplitude value $V_{DD}$ can be obtained.

FIGS. 4A and 4B are operational waveform diagrams of the amplitude normalization circuit 40, according to some embodiments. FIG. 4A shows a waveform of a full-wave rectified voltage $v_{pk2}(t)$ obtained when a full-wave rectified voltage $v_{pk1}(t)$ in an output of the diode bridge (DB) 14 is attenuated, and a peak detected voltage $pv_{pk2}(t)$ of the full-wave rectified voltage $v_{pk2}(t)$. FIG. 4B shows the waveform of the full-wave rectified voltage $v_{pk2}(t)$ and a triangular wave voltage $v_{TR}(t)$ that are inputs to the PWM comparator 16. A period T may, for example, be represented by 20 msec for a frequency 50 Hz of the AC voltage $v_{in}(t)$ and a frequency 100 Hz of the full-wave rectified voltage $v_{pk1}(t)$ and the full-wave rectified voltage $v_{pk2}(t)$. The PWM sampling frequency $f_s$ is, for example, about 200 kHz to about 500 kHz and the period of the triangular wave voltage $v_{TR}(t)$ may be, for example, about 2 μsec to about 5 μsec. The triangular wave voltage $v_{TR}(t)$ shown in FIG. 4B is schematically illustrated. When the period is about 2 μsec to about 5 μsec, in practice, a continuous waveform of very fine triangular waves is obtained.

In the amplitude normalization circuit 40, the PWM signal outputted from the comparator 16, which compares the triangular wave voltage $v_{TR}(t)$ having the peak value $V_{pk2}$ detected by the peak detector 6 with the full-wave rectified voltage $v_{pk2}(t)$, is waveform-converted by the waveform converter 24 and is outputted as the output voltage $v_{out}(t)$ with the amplitude value $V_{DD}$. On this account, only the "waveform" of the full-wave rectified voltage $v_{pk1}(t)$ of the AC voltage $v_m(t)$ can be generated with the constant amplitude value $V_{DD}$.

In addition, in the amplitude normalization circuit 40, a waveform with a constant amplitude can be extracted with a relatively simple circuit configuration, independently from an input voltage and without requiring complicated arithmetic operations as in the comparative example of the amplitude normalization circuit 40A so that it is possible to generate good reproducibility of the "waveform."

In particular, when the amplitude normalization circuit 40 is implemented in an LSI (Large Scale Integration), chip area can be saved, which may result in a reduction of costs.

FIGS. 5A to 5C are operational waveform diagrams of the amplitude normalization circuit 40, according to some embodiments. FIG. 5A shows a waveform of the triangular wave voltage $v_{TR}(t)$, inputted to the PWM comparator 16, indicating a high level constant voltage $V_H$ and a low level constant voltage $V_L$. FIG. 5B shows an example of a waveform of a PWM comparator output voltage $v_{out\_L}(t)$ in the case of the comparison of the triangular wave voltage $v_{TR}(t)$ with the low level constant voltage $V_L$, and FIG. 5C shows an example of a waveform of a PWM comparator output voltage $v_{out\_H}(t)$ in the case of the comparison of the triangular wave voltage $v_{TR}(t)$ with the high level constant voltage $V_H$.

FIGS. 6A to 6E are operational waveform diagrams of the amplitude normalization circuit 40, according to some other embodiments. FIG. 6A shows waveforms resulting from the comparison of each of the full-wave rectified voltage $v_{pk2}(t)$ respectively having amplitudes of 100%, 63%, 45% or 27% of the peak value $V_{pk2}$ with the triangular wave voltage $v_{TR}(t)$. FIG. 6B shows an example of a PWM comparator output voltage waveform (PWM1) in the case of the comparison of the full-wave rectified voltage $0.27v_{pk2}(t)$ having an amplitude of 27% of the peak value $V_{pk2}$ with the triangular wave voltage $v_{TR}(t)$. FIG. 6C shows an example of a PWM comparator output voltage waveform (PWM2) in case of the comparison of the full-wave rectified voltage $0.45v_{pk2}(t)$ having amplitude of 45% of the peak value $V_{pk2}$ with the triangular wave voltage $v_{TR}(t)$. FIG. 6D shows an example of a PWM comparator output voltage waveform (PWM3) in the case of the comparison of the full-wave rectified voltage $0.63v_{pk2}(t)$ having amplitude of 63% of the peak value $V_{pk2}$ with the triangular wave voltage $v_{TR}(t)$. FIG. 6E shows an example of a PWM comparator output voltage waveform (PWM4) in the case of the comparison of a full-wave rectified voltage $v_{pk2}(t)$ having amplitude of 100% of the peak value $V_{pk2}$ with the triangular wave voltage $v_{TR}(t)$.

In the waveform example shown in FIG. 6A, the peak value $V_R$ of the triangular wave voltage $v_{TR}(t)$ is set to be lower than the peak value $V_{pk2}$ of the full-wave rectified voltage $v_{pk2}(t)$. The peak value $V_R$ of the triangular wave voltage $v_{TR}(t)$ can be adjusted based on the power supply voltage of the buffer 12 shown in FIG. 3. The peak value $V_R$ of the triangular wave voltage $v_{TR}(t)$ may be set to be equal to the peak value $V_{pk2}$ of the full-wave rectified voltage $v_{pk2}(t)$, as shown in FIG. 4B.

Power Supply

Comparative Example

Figure 7:
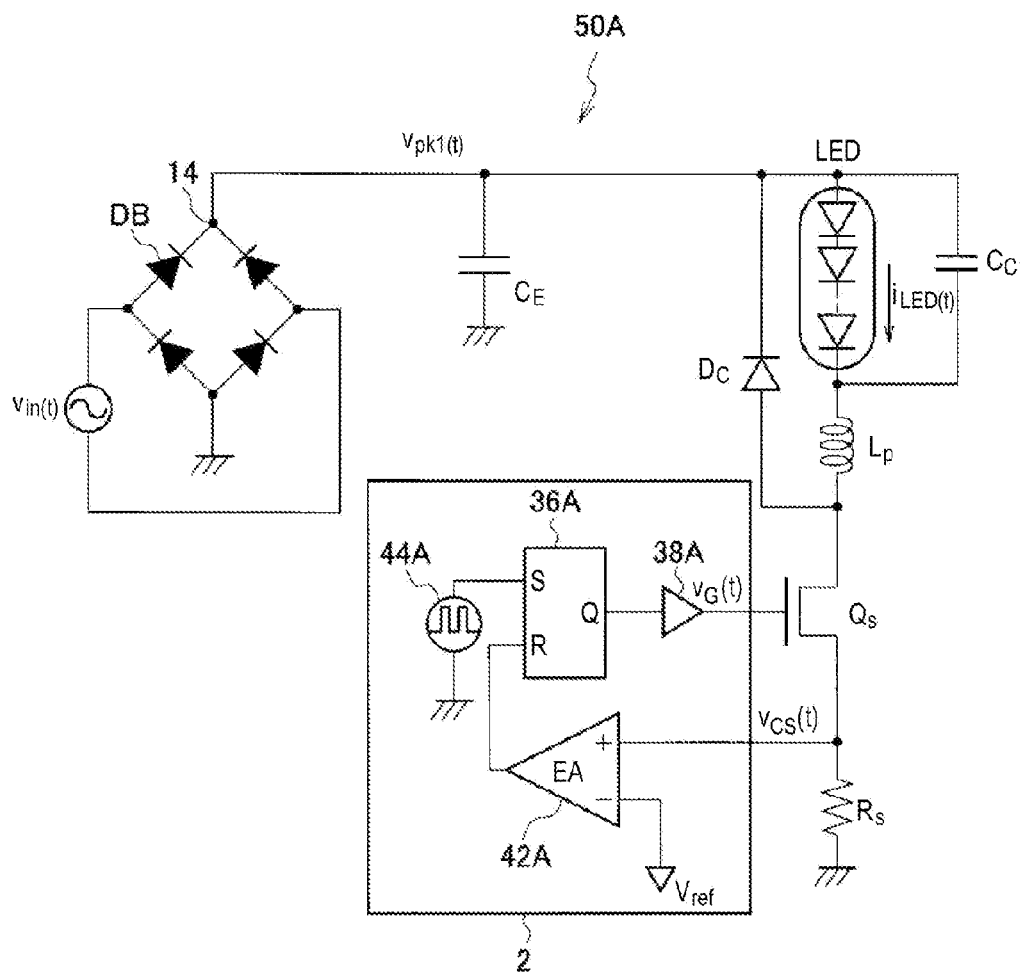
FIG. 7 is a schematic circuit diagram of a comparative example of a power supply as a step-down LED lighting device having a pulse width modulation (PWM) fixed frequency control.

FIG. 7 shows a comparative example of a schematic circuit diagram of a power supply 50A as a step-down LED lighting device having a PWM fixed frequency control.

Referring to FIG. 7, the comparative example of the power supply 50A includes a diode bridge (DB) 14 connected to an AC voltage $v_{in}(t)$, an electrolytic capacitor $C_E$ having a small capacitance value that is connected to the diode bridge (DB) 14, an inductance $L_P$ connected to the AC line via a load (LED), a current sense resistor $R_S$ connected to a ground potential, a MOSFET $Q_S$ connected in series between the inductance $L_P$ and the current sense resistor $R_S$, and a power supply control circuit 2 connected to the MOSFET $Q_S$ and the current sense resistor $R_S$ and capable of providing the PWM fixed frequency control for a LED conduction current $i_{LED}(t)$.

A regenerative snubber capacitor $C_C$ is connected in parallel to the load (LED) and a regenerative snubber diode $D_C$ is connected to a series circuit of the load (LED) and the inductance $L_P$ to form a step-down LED lighting device.

The power supply control circuit 2 includes an error amplifier 42A connected to the current sense resistor $R_S$, a RS flip-flop 36A connected to a PWM signal generator 44A and an output of the error amplifier 42A for outputting a control signal for the MOSFET $Q_S$, and a buffer 38A connected to an output of the RS flip-flop 36A for driving the MOSFET $Q_S$. A current sense voltage $v_{CS}(t)$ is input to a positive input of the error amplifier 42A and a reference voltage $V_{ref}$ of a specified voltage level is input to a negative input of the error amplifier 42A.

With respect to the PWM fixed frequency control operation, a PWM signal of a fixed frequency is input to a set terminal S of the RS flip-flop 36A. The output of the error amplifier 42A is input to a reset terminal R of the RS flip-flop 36A.

The MOSFET Qs is turned on at a set operation timing of the RS flip-flop 36A and is turned off at a reset operation timing of the RS flip-flop 36A.

Figure 8A:
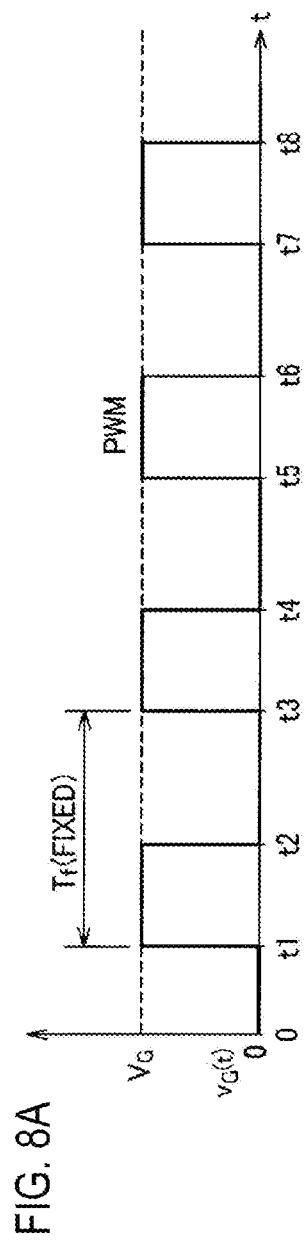
FIGS. 8A to 8C are operational waveform diagrams of the comparative example power supply.
Figure 8B:
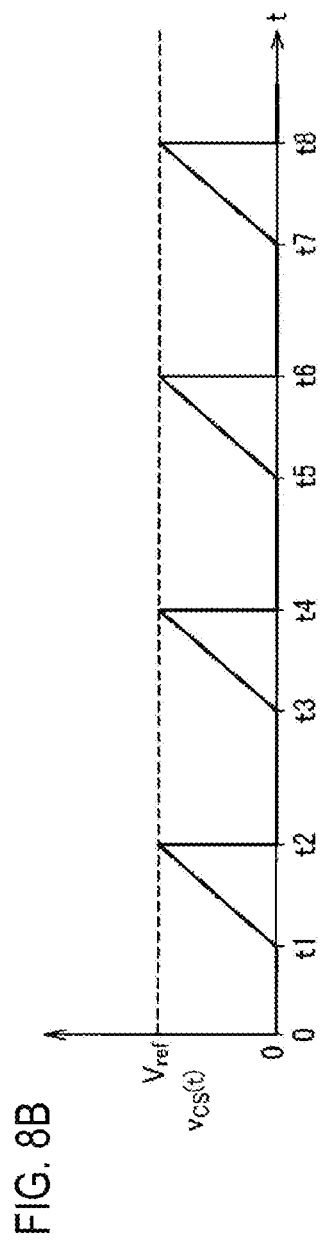
Figure 8C:
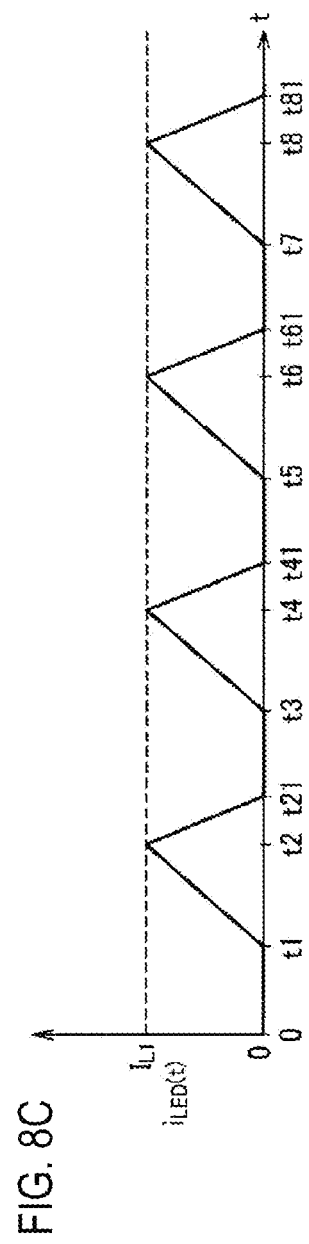

FIGS. 8A to 8C are operational waveform diagrams of the comparative example power supply 50A. FIG. 8A shows an exemplary waveform of a gate voltage $v_G(t)$, FIG. 8B shows an exemplary waveform of the current sense voltage $v_{CS}(t)$, and FIG. 8C shows exemplary waveform of LED conduction current $i_{LED}(t)$.

The gate voltage $v_G(t)$ has a PWM waveform in synchronization with the PWM signal outputted from the PWM signal generator 44A. The MOSFET Qs is turned on/off in response to this PWM waveform.

The gate voltage $v_G(t)$ has a fixed period $T_f$(FIXED), as shown in FIG. 8A. Since the PWM fixed frequency is, for example, about 200 kHz to about 500 kHz, the corresponding fixed period $T_f$(FIXED) is, for example, about 2 μsec to about 5 μsec.

First, at time t1, when the gate voltage $v_G(t)$ is an on state as shown in FIG. 8A, the MOSFET $Q_S$ is turned on so that the current sense voltage $v_{CS}(t)$ is increased as shown in FIG. 8B and the LED conduction current $i_{LED}(t)$ is also increased as shown in FIG. 8C.

Next, at time t2, when the PWM signal is turned off and the gate voltage $v_G(t)$ is an off state as shown in FIG. 8A, the current sense voltage $v_{CS}(t)$ to be compared with the reference voltage $V_{ref}$ in the error amplifier 42A is sharply decreased as shown in FIG. 8B. On the other hand, when the MOSFET $Q_S$ is turned off, since a counter electromotive force is generated in the inductance $L_p$, the LED conduction current $i_{LED}(t)$ is slowly decreased from a current value $I_{L1}$ at time t2 to zero at time t21, as shown in FIG. 8C.

Next, after lapse of a specific time determined according to the fixed period $T_f$(FIXED), the gate voltage $v_G(t)$ is in an on state again at time t3 and thereafter, the same operations as those of time t1 to time t3 are repeated.

FIGS. 9A and 9B are additional operational waveform diagrams of the comparative example power supply 50A. FIG. 9A shows an exemplary waveform of the LED conduction current $i_{LED}(t)$ and FIG. 9B shows an exemplary waveform of the full-wave rectified voltage $v_{pk1}(t)$ in the output of the diode bridge (DB) 14.

In the power supply 50A as the step-down LED lighting device having PWM fixed frequency control according to the comparative example, as shown in FIGS. 9A and 9B, the peak value $I_{L1}$ of the LED conduction current $i_{LED}(t)$ is constant with respect to the full-wave rectified voltage $v_{pk1}(t)$. That is, the LED conduction current $i_{LED}(t)$ does not follow a change in the waveform of the full-wave rectified voltage $v_{pk1}(t)$ but has a constant current value $I_{L1}$ independently from the change in the waveform of the full-wave rectified voltage $v_{pk1}(t)$. Therefore, a power factor (PF) of the power supply 50A according to the comparative example is lower than a power factor of a power supply 50 according to some embodiments of the present disclosure, as will be described later, and thus, has a room for improvement.

Figure 10:
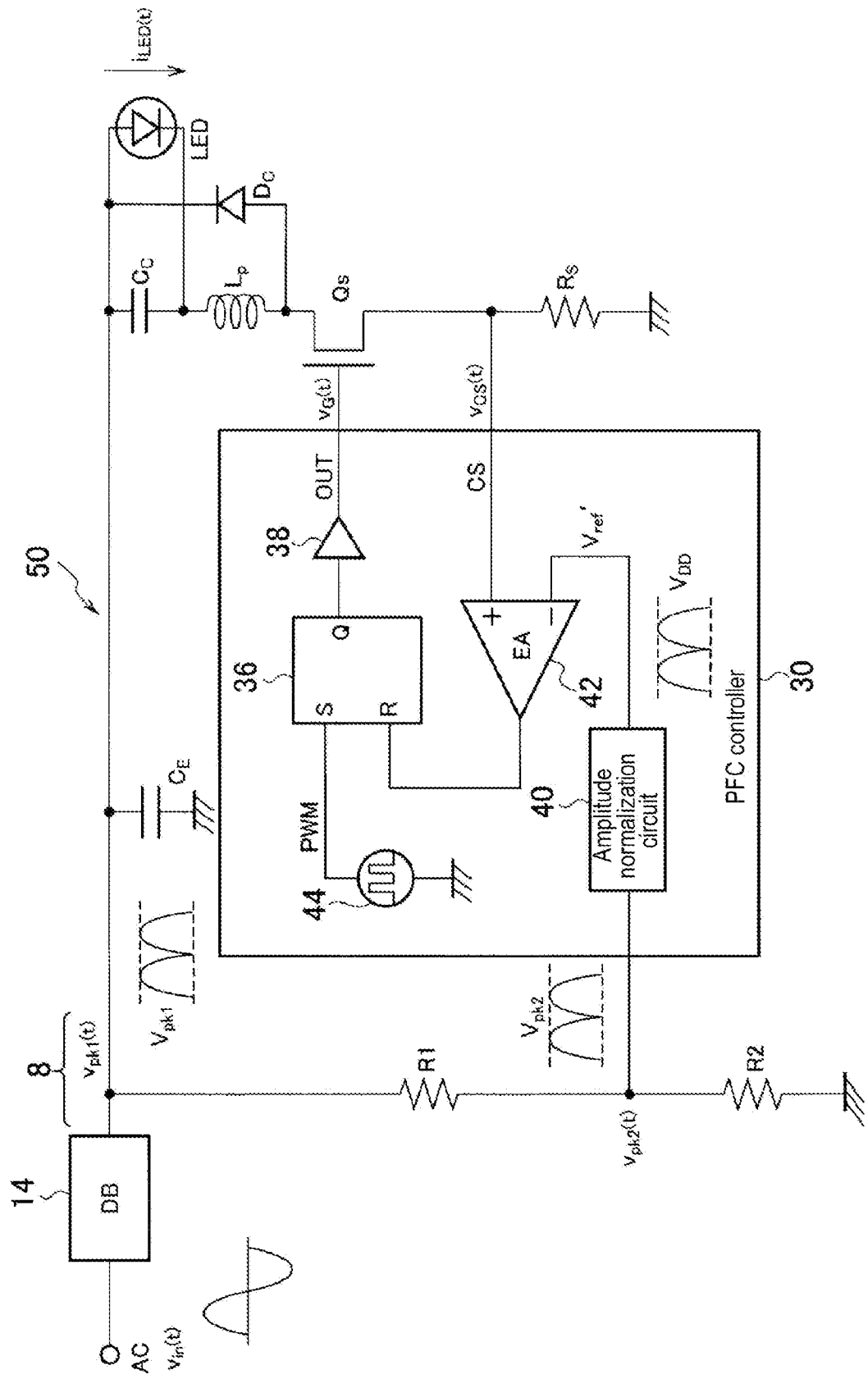
FIG. 10 is a schematic circuit diagram of a power supply including an amplitude normalization circuit, as a single-stage PFC step-down LED lighting device, according to some embodiments.

FIG. 10 is a schematic circuit block configuration of a power supply 50 including an amplitude normalization circuit 40, as a single-stage PFC (Power Factor Correction) step-down LED lighting device, according to some embodiments.

Referring to FIG. 10, the power supply 50 including the amplitude normalization circuit 40 includes a diode bridge (DB) 14 connected to an AC voltage $v_{in}(t)$, an electrolytic capacitor $C_E$ having a small capacitance value that is connected to the diode bridge (DB) 14, an inductance $L_P$ connected to an AC line via a load (LED), a current sense resistor $R_S$ connected to a ground potential, a MOSFET $Q_S$ connected in series between the inductance $L_P$ and the current sense resistor $R_S$, and a PFC controller 30 connected to the MOSFET $Q_S$ and the current sense resistor $R_S$ and capable of providing a PFC control for a LED conduction current $i_{LED}(t)$.

A regenerative snubber capacitor $C_C$ is connected in parallel to the load (LED) and a regenerative snubber diode $D_C$ is connected to a series circuit of the load (LED) and the inductance $L_P$ to form a PFC step-down LED lighting device.

In addition, as shown in FIG. 10, the power supply 50 including the amplitude normalization circuit 40 may include an attenuator 8 for attenuating a full-wave rectified voltage $v_{pk1}(t)$ of an AC voltage $v_{in}(t)$ to a full-wave rectified voltage $v_{pk2}(t)$.

As shown in FIG. 10, the PFC controller 30 includes the amplitude normalization circuit 40 connected to the attenuator 8, an error amplifier 42 connected to the amplitude normalization circuit 40 and the current sense resistor $R_S$, a RS flip-flop 36 connected to a PWM signal generator 44 and an output of the error amplifier 42 for outputting a PWM control signal for the MOSFET $Q_S$, and a buffer 38 connected to an output of the RS flip-flop 36 for driving the MOSFET $Q_S$.

The amplitude normalization circuit 40 of FIG. 10 may include, as in FIGS. 2 and 3, a peak detector 6 for detecting a peak value $V_{pk2}$ of the full-wave rectified voltage $v_{pk2}(t)$, a triangular wave oscillator 4 for generating a triangular wave voltage $v_{TR}(t)$, a comparator 16 for comparing the full-wave rectified voltage $v_{pk2}(t)$ and the triangular wave voltage $v_{TR}(t)$ and outputting a PWM signal, and a waveform converter 24 for converting a waveform of the PWM signal and outputting an output voltage $v_{out}(t)$ having a constant amplitude $V_{DD}$. The waveform converter 24 may include a level shifter 20 for shifting a level of the PWM signal, and a LPF 22 for filtering the level-shifted PWM signal.

Referring back to FIG. 10, the MOSFET $Q_S$ is turned on at a set operation timing of the RS flip-flop 36 and is turned off at a reset operation timing of the RS flip-flop 36.

Figure 11A:
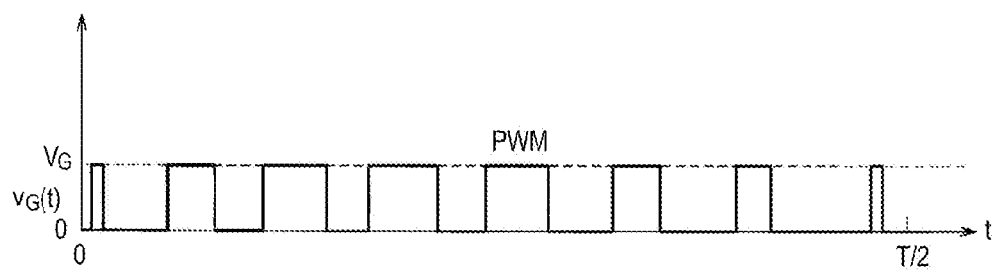
FIGS. 11A to 11D are operational waveform diagrams of the power supply including the amplitude normalization circuit of FIG. 10, according to some embodiments.
Figure 11B:
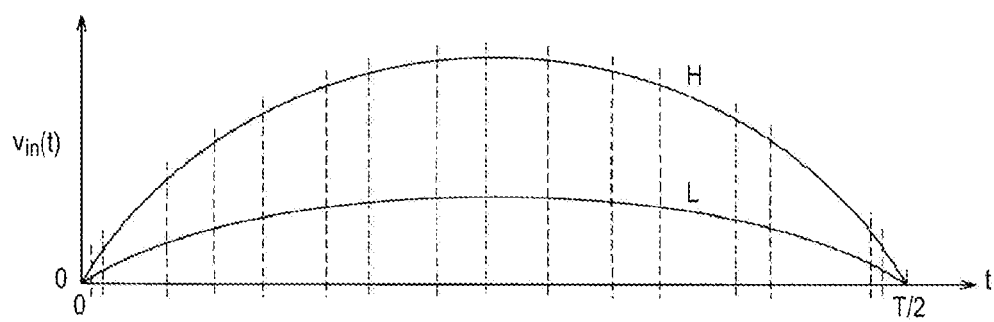
Figure 11C:
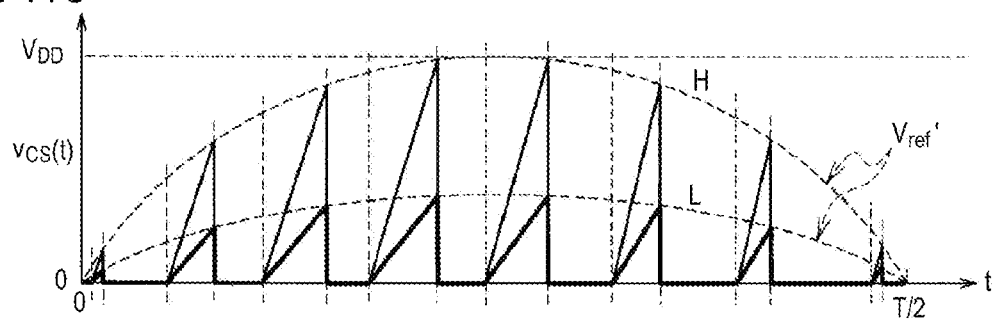
Figure 11D:
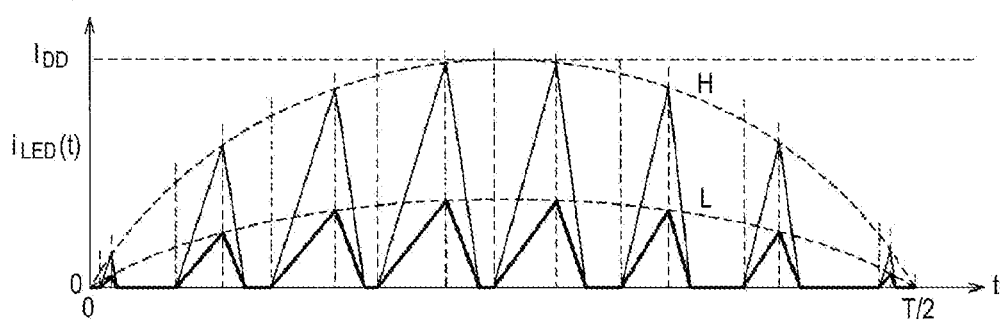

FIGS. 11A to 11D are operational waveform diagrams of the power supply 50 including the amplitude normalization circuit 40, according to some embodiments. FIG. 11A shows a waveform of a gate voltage $v_G(t)$ (PWM); FIG. 11B shows waveforms of the AC voltage $v_{in}(t)$ (with high level H and low level L); FIG. 11C shows waveforms of a current sense voltage $v_{CS}(t)$ corresponding to the waveforms of the AC voltage $v_{in}(t)$ (with high level H and low level L; and where the peak value of the waveform of the current sense voltage $v_{CS}(t)$ corresponding to the waveform of the AC voltage $v_{in}(t)$ with high level H is $V_{DD}$); and FIG. 11D shows waveforms of a LED conduction current $i_{LED}(t)$ (with high level H and low level L).

In FIG. 11C, each of the dotted envelopes represents a reference voltage $V_{ref}'$. As shown in FIG. 10, the current sense voltage $v_{CS}(t)$ is supplied to a positive input terminal of the error amplifier 42 and the reference voltage $V_{ref}'$ supplied to a negative input terminal of the error amplifier 42. Accordingly, when the current sense voltage $v_{CS}(t)$ exceeds the reference voltage $V_{ref}'$, the waveform of the current sense voltage $v_{CS}(t)$ is rapidly attenuated to a zero potential, as shown in FIG. 11C.

Since it takes a certain amount of time until energy stored in the inductance $L_P$ is discharged, the exemplary waveforms of the LED conduction current $i_{LED}(t)$ are attenuated to a zero level after delay of the certain time period as shown in FIG. 11D.

Each of the dotted envelopes of the waveforms of the LED conduction current $i_{LED}(t)$ is in phase with the full-wave rectified voltage $v_{pk1}(t)$.

A peak value of the current sense voltage $v_{CS}(t)$ of the high level H corresponds to $V_{DD}$ and a peak value of the high level H of the LED conduction current $i_{LED}(t)$ corresponds to $I_{DD}$.

Figure 12:
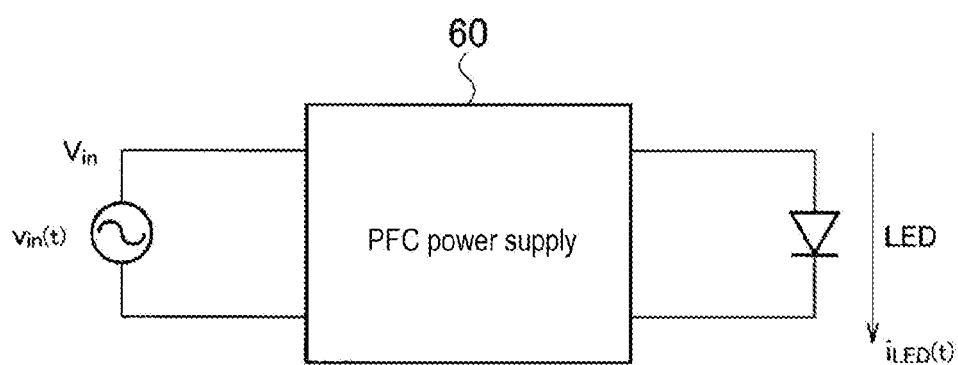
FIG. 12 is a block diagram of a PFC power supply circuit having an AC voltage and a load (LED), according to some embodiments.

FIG. 12 is a schematic view of a PFC power supply circuit 60 connected to an AC voltage $v_{in}(t)$ and a load (LED) (LED conduction current $i_{LED}(t)$). The PFC power supply circuit 60 corresponds to a circuit system between the AC voltage $v_{in}(t)$ and the load (LED) in the power supply 50 shown in FIG. 10.

Figure 13A:
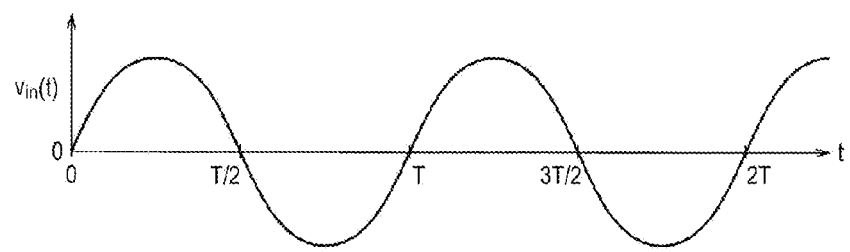
FIGS. 13A to 13C are operational waveform diagrams of a power supply including an amplitude normalization circuit of FIG. 12, according to some embodiments.
Figure 13B:
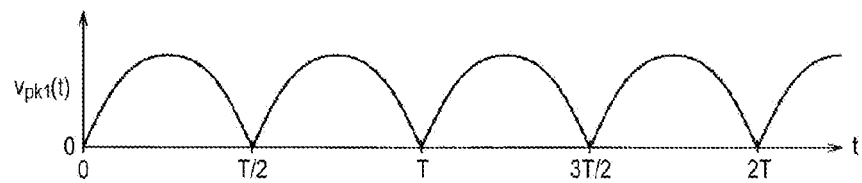
Figure 13C:
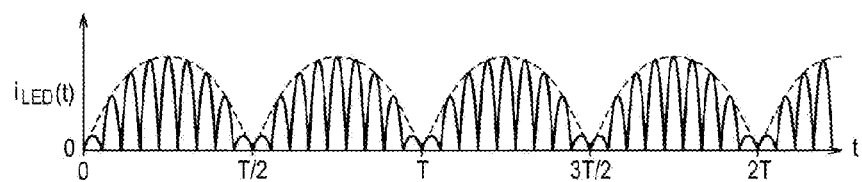

FIGS. 13A to 13C are operation waveform diagrams of a power supply 50 including a amplitude normalization circuit 40 according to an embodiment. FIG. 13A shows an exemplary waveform of AC voltage $v_{in}(t)$, FIG. 13B shows an exemplary waveform of full-wave rectified voltage $v_{pk1}(t)$ in an output of a diode bridge (DB) 14, and FIG. 13C shows an exemplary waveform of a LED conduction current $i_{LED}(t)$. As shown in FIG. 13C, an envelope (indicated by a dotted line) of the waveform of the LED conduction current $i_{LED}(t)$ is in phase with the waveform of the full-wave rectified voltage $v_{pk1}(t)$. That is, the LED conduction current $i_{LED}(t)$ has a waveform which follows the waveform of the full-wave rectified voltage $v_{pk1}(t)$ in phase therewith. On this account, the power factor (PF) of the power supply 50 according to the embodiment is improved over the power factor of the power supply 50A according to the comparative example.

Figure 14:
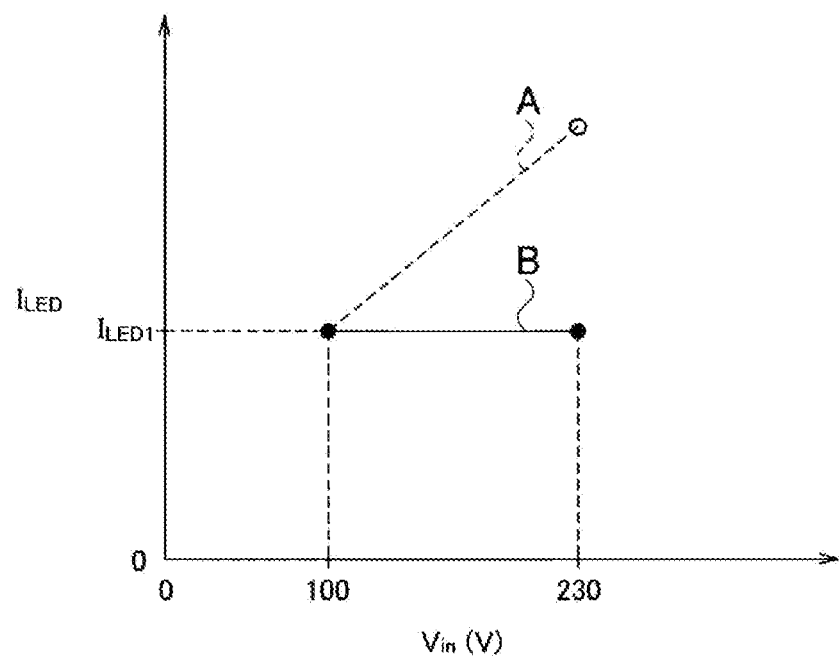
FIG. 14 is a graphical view showing a line regulation (input power supply voltage characteristics) of a power supply having an amplitude normalization circuit, according to some embodiments.

FIG. 14 is a view showing line regulation (input power supply voltage characteristics) of a power supply 50 including an amplitude normalization circuit 40 according to an embodiment. The amplitude value $V_{in}(V)$ of the AC voltage $v_{in}(t)$ may be, for example, about 100 V for Japan and about 230 V for Europe.

The line regulation (input power supply voltage characteristics) of the power supply 50 including the amplitude normalization circuit 40 according to the embodiment is nearly constant even when the amplitude value $V_{in}(V)$ of the AC voltage $v_{in}(t)$ is increased, as indicated by line B in FIG. 14. That is, the value of the LED conduction current $i_{LED}(t)$ is $I_{LED1}$ which exhibits good line regulation (input power supply voltage characteristics).

On the other hand, in the comparative example, the amplitude value $I_{LED}$ of the LED conduction current $i_{LED}(t)$ is increased with increase of the amplitude value $V_{in}(V)$ of the AC voltage $v_{in}(t)$, as indicated by line A in FIG. 14.

In a power supply 50 including an amplitude normalization circuit 40, as a single stage PFC step-down LED lighting device according to an embodiment, since the amplitude value $V_{DD}$ of the output voltage $v_{out}(t)$ of the amplitude normalization circuit 40 can be made constant without depending on the amplitude value $V_{in}(V)$ of the AC voltage $v_{in}(t)$, it is possible to obtain good line regulation (input power supply voltage characteristics).

(Step-Up LED Lighting Device)

The power supply 50 provided with the PFC controller 30 including the amplitude normalization circuit 40 according to an embodiment may be used for a wide range of power supplies, including, for example, a step-up LED lighting device and a flyback LED lighting device, in addition to the above-described step-down LED lighting device.

Figure 15:
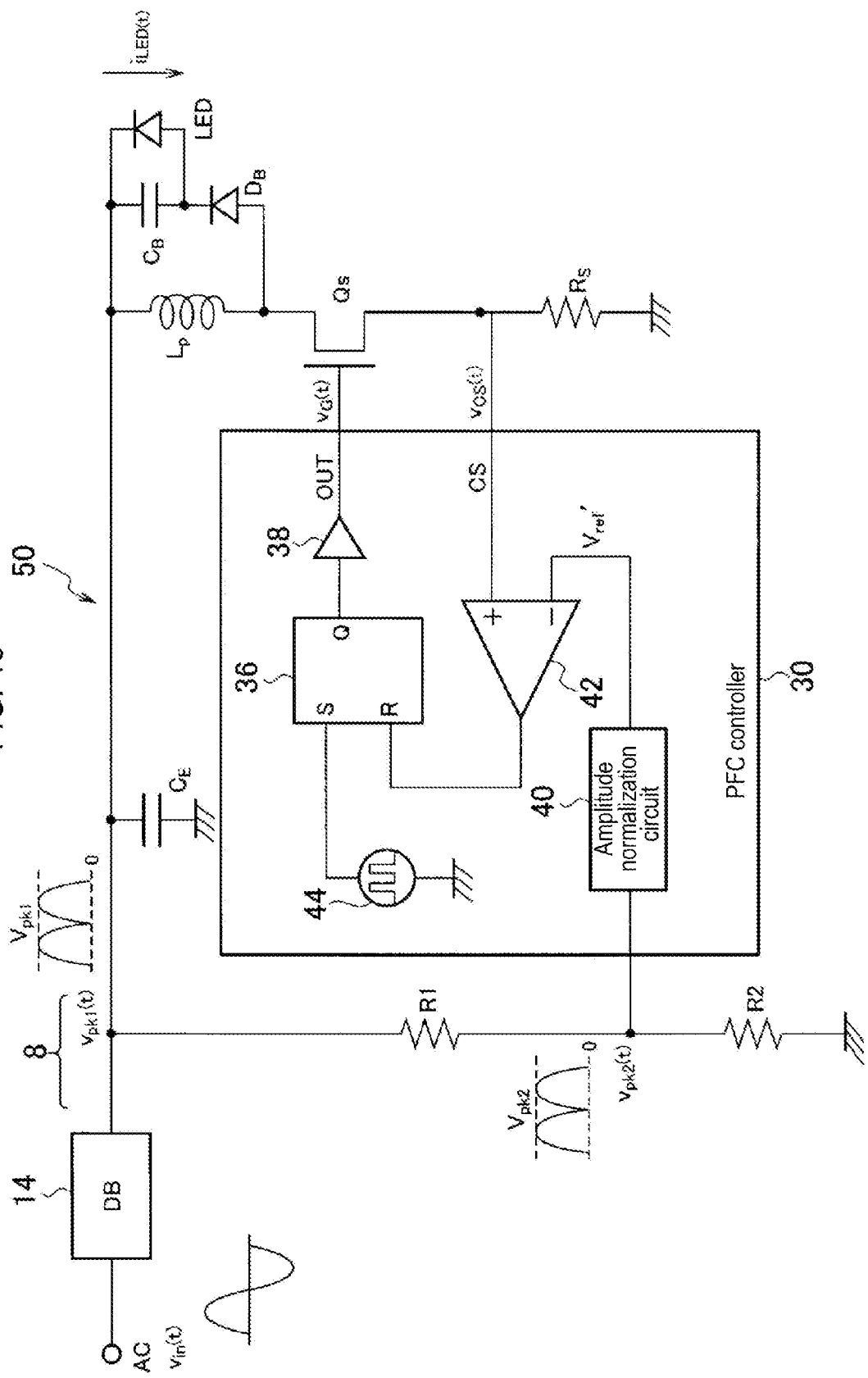
FIG. 15 is a schematic circuit block diagram of a step-up LED lighting device provided with a PFC controller including an amplitude normalization circuit, according to some embodiments.

FIG. 15 shows a schematic circuit configuration of a power supply 50 provided with a PFC controller 30 including an amplitude normalization circuit 40, as a step-up LED lighting device, according to an embodiment.

Referring to FIG. 15, the power supply 50 including the amplitude normalization circuit 40 according to an embodiment includes an inductance $L_P$ connected to an AC line, a current sense resistor $R_S$ connected to a ground potential, a MOSFET $Q_S$ connected in series between the inductance $L_P$ and the current sense resistor $R_S$, and a PFC controller 30 connected to the MOSFET $Q_S$ and the current sense resistor $R_S$ and capable of providing a PFC control of a LED conduction current $i_{LED}(t)$ flowing into a load (LED).

In the power supply 50 including the amplitude normalization circuit 40 according to an embodiment, as shown in FIG. 15, the inductance $L_P$ is connected in parallel to a series circuit of a regenerative capacitor $C_B$ and a regenerative diode (snubber diode) $D_B$ and the regenerative capacitor $C_B$ is connected in parallel to a load (LED) to form a step-up LED lighting device.

As shown in FIG. 15, the power supply 50 including the amplitude normalization circuit 40 according to an embodiment includes a diode bridge (DB) 14 connected to an AC voltage $v_{in}(t)$, the inductance $L_P$ connected to the AC line via the load (LED), a current sense resistor $R_S$ connected to a ground potential, the MOSFET $Q_S$ connected in series between the inductance $L_P$ and the current sense resistor $R_S$, and the PFC controller 30 including the amplitude normalization circuit 40 and connected to the MOSFET $Q_S$ and the current sense resistor $R_S$ and capable of providing a PFC control of a LED conduction current $i_{LED}(t)$ flowing into the load (LED).

As shown in FIG. 15, the PFC controller 30 includes a PWM signal generator 44, an error amplifier 42 having a positive input terminal connected to the current sense resistor $R_S$ and a negative input terminal connected to an output $V_{ref}'$ the amplitude normalization circuit 40, a RS flip-flop 36 connected to an output of the PWM signal generator 44 and an output of the error amplifier 42 for outputting a PWM control signal for the MOSFET $Q_S$, and a buffer 38 connected to an output of the RS flip-flop 36 for driving the MOSFET $Q_S$.

The MOSFET $Q_S$ is turned on at a set operation timing of the RS flip-flop 36 and is turned off at a reset operation timing of the RS flip-flop 36. Other configurations are the same as those in the power supply 50 including the amplitude normalization circuit 40 shown in FIG. 10 and, therefore, explanation of which will not be repeated in the interest of brevity.

In the power supply 50 including the amplitude normalization circuit 40, as the step-up LED lighting device, according to some embodiments, since an amplitude value $V_{DD}$ of the output voltage $v_{out}(t)$ of the amplitude normalization circuit 40 is made constant without depending on the amplitude value $V_{in}(V)$ of the AC voltage $v_{in}(t)$, good line regulation (input power supply voltage characteristics) can be obtained.

(Flyback LED Lighting Device)

Figure 16:
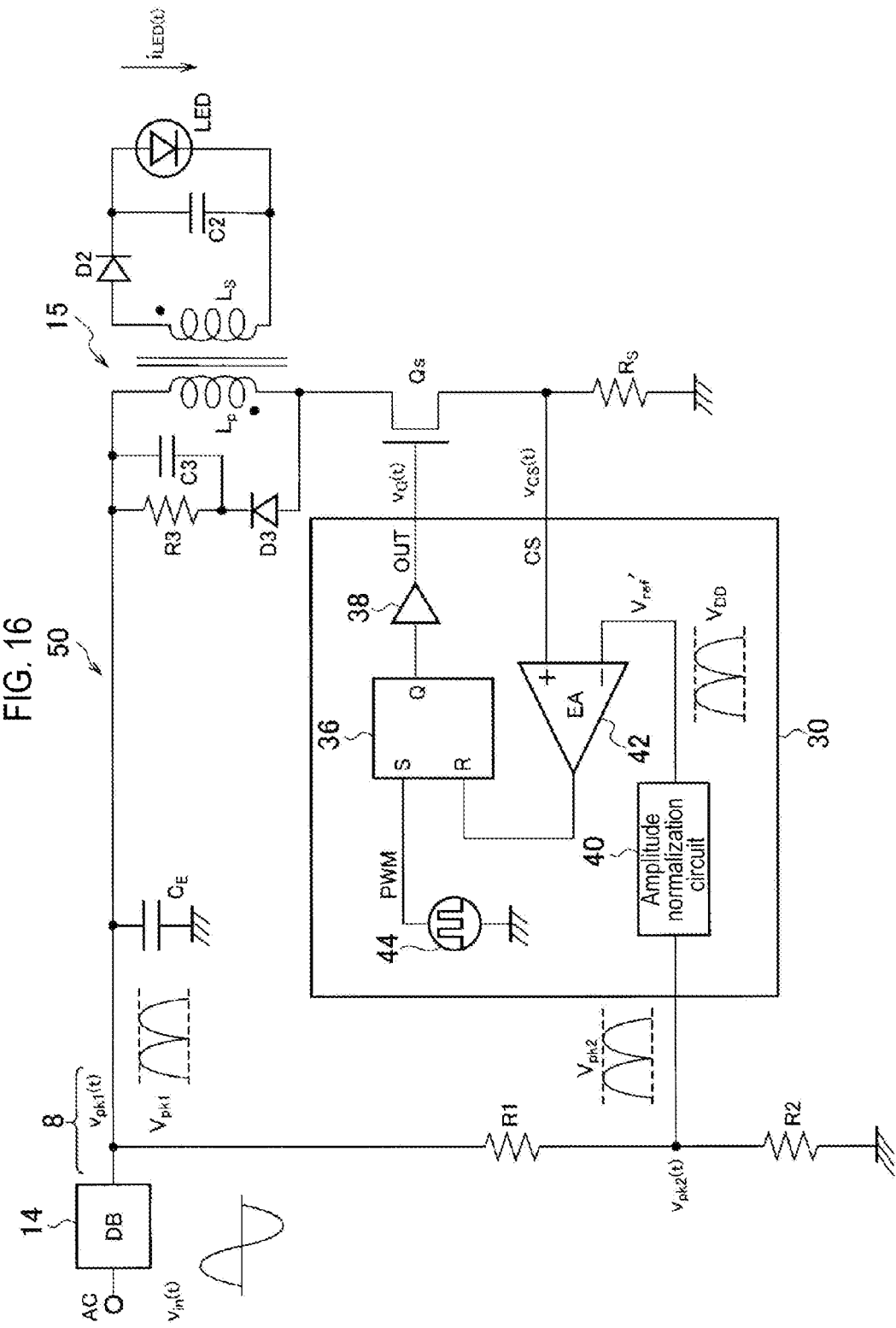
FIG. 16 is a schematic circuit block diagram of a flyback LED lighting device provided with a PFC controller including an amplitude normalization circuit, according to some embodiment.

FIG. 16 shows a schematic circuit block diagram of a flyback LED lighting device provided with a PFC controller 30 including an amplitude normalization circuit 40, according to some embodiments.

Referring to FIG. 16, a power supply 50 including the amplitude normalization circuit 40 also includes an inductance $L_P$ connected to an AC line, a current sense resistor $R_S$ connected to a ground potential, a MOSFET $Q_S$ connected in series between the inductance $L_P$ and the current sense resistor $R_S$, and a PFC controller 30 connected to the MOSFET $Q_S$ and the current sense resistor $R_S$ and capable of providing a PFC control of a LED conduction current $i_{LED}(t)$ flowing into a load (LED).

In the power supply 50 including the amplitude normalization circuit 40, as shown in FIG. 16, the inductance $L_P$ constitutes a primary side inductance of a flyback transformer 15. A diode rectifying circuit D2·C2 including a diode D2 and a capacitor C2 is connected to a secondary side inductance $L_S$ of the flyback transformer 15 and the load (LED) is connected in parallel to the capacitor C2. In addition, as shown in FIG. 16, a snubber circuit D3·R3·C3 including a diode D3, a resistor R3 and a capacitor C3 is connected in parallel to the inductance $L_P$. Other configurations are the same as those in the power supply 50 including the amplitude normalization circuit 40 according to the embodiment shown in FIG. 15 and, therefore, explanation of which will not be repeated in the interest of brevity.

In the power supply 50 including the amplitude normalization circuit 40, as the flyback LED lighting device according to the embodiment, since the amplitude value $V_{DD}$ of the output voltage $v_{out}(t)$ of the amplitude normalization circuit 40 is made constant without depending on the amplitude value $V_{in}(V)$ of the AC voltage $v_{in}(t)$, good line regulation (input power supply voltage characteristics) can be obtained.

(Electronic Apparatuses)

The power supply 50 including the amplitude normalization circuit 40 may be incorporated in various types of electronic apparatuses, including a smartphone, a laptop PC, a tablet PC, a monitor, a TV, an external hard disk drive, a set-top box, a vacuum cleaner, a refrigerator, a washing machine, a telephone, a facsimile, a printer, a laser display, a communication terminal, a server and so on.

The amplitude normalization circuit 40 can generate good reproducibility of an input voltage waveform with constant amplitude, independently from the amplitude of the input voltage waveform, with a simple configuration.

In addition, the power supply 50 including the amplitude normalization circuit can achieve good line regulation (input power supply voltage characteristics) with constant amplitude, independently from the amplitude of the input voltage waveform, with a simple configuration.

In addition, as the power supply 50 including the amplitude normalization circuit, a step-down LED lighting device/a step-up LED lighting device/a flyback LED lighting device having a PFC controller including the amplitude normalization circuit 40 may be realized.

As described above, according to the present disclosure, it is possible to provide an amplitude normalization circuit with a simple configuration which is capable of providing good reproducibility of an input voltage waveform with constant amplitude independently from the amplitude of an input voltage waveform, and achieve a power supply and an electronic apparatus including the amplitude normalization circuit, which is capable of providing good line regulation (input power supply voltage characteristics).

Other Embodiments

As described above, the present disclosure has been illustrated by way of some embodiments, but the description and drawings which constitute a part of this disclosure are exemplary and should not be construed to limit the present disclosure. Various alternative embodiments, examples and operation techniques will be apparent to those skilled in the art from this disclosure.

Thus, the present disclosure includes other different embodiments which are not described herein.

According to the present disclosure in some embodiments, it is possible to provide an amplitude normalization circuit with a simple configuration which is capable of providing good reproducibility of an input voltage waveform with constant amplitude independently from the amplitude of an input voltage waveform, and a power supply and an electronic apparatus including the amplitude normalization circuit, which is capable of providing good line regulation (input power supply voltage characteristics).

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

INDUSTRIAL APPLICABILITY

The amplitude normalization circuit, the power supply and the electronic apparatus of the present disclosure can be used in a wide range of fields including an AC/DC converter, a DC/DC converter, an LED lighting device, a power factor correction circuit for LED lighting, household electrical appliance, a mobile device and so on.

What is claimed is:
1. An amplitude normalization circuit comprising:
a peak detector configured to detect a peak value of a full-wave rectified voltage of an AC voltage;
a triangular wave oscillator connected to the peak detector, configured to generate a triangular wave voltage having a peak based on the peak value of the full-wave rectified voltage;

a comparator connected to the triangular wave oscillator, configured to compare the triangular wave voltage with the full-wave rectified voltage and output a pulse width modulation signal; and a waveform converter connected to the comparator, configured to convert a waveform of the pulse width modulation signal and output an output voltage with a constant amplitude, wherein the waveform converter includes:
 a level shifter configured to shift a level of the pulse width modulation signal; and
 a low pass filter connected to the level shifter, configured to filter the level-shifted pulse width modulation signal.

2. The amplitude normalization circuit of claim 1, wherein the peak detector includes:
 a peak detecting part including a diode having an anode to which the full-wave rectified voltage is supplied and a capacitor connected in series between a cathode of the diode and a ground potential; and
 a buffer connected to a node between the diode and the capacitor, configured to output a voltage with a value equal to the peak value.

3. The amplitude normalization circuit of claim 1, wherein the triangular wave oscillator includes:
 a current source connected to the peak detector;
 a reset capacitor connected in series between the current source and a ground potential;
 a reset comparator connected to the current source, configured to output a reset signal; and
 a reset MOS transistor connected in parallel to the reset capacitor and being turned on/off based on the reset signal,
 wherein the triangular wave oscillator generates a triangular wave voltage having a frequency equal to a sampling frequency of the pulse width modulation signal across the reset capacitor.

4. The amplitude normalization circuit of claim 1, wherein the comparator includes a pulse width modulation comparator having a positive input terminal to which the full-wave rectified voltage is inputted and a negative input terminal to which the triangular wave voltage is inputted, the pulse width modulation comparator being configured to compare the full-wave rectified voltage with the triangular wave voltage and output a pulse width modulation signal with constant amplitude.

5. The amplitude normalization circuit of claim 1, wherein the level shifter includes a CMOS circuit including a p-channel MOS transistor that is connected in series between a ground potential and a power supply voltage having a value equal to the constant amplitude and has a source connected to the power supply voltage, and an n-channel MOS transistor having a source connected to the ground potential,
 wherein the level-shifted pulse width modulation signal is output at a node between a drain of the p-channel MOS transistor and a drain of the n-channel MOS transistor.

6. The amplitude normalization circuit of claim 5, wherein the low pass filter includes a filter resistor and a filter capacitor that are connected in series between the ground potential and an output of the CMOS circuit,
 wherein an output voltage having the constant amplitude is generated across the filter capacitor.

7. The amplitude normalization circuit of claim 1, wherein a sampling frequency of the pulse width modulation signal is higher by three or more orders of magnitude than a frequency of a waveform of the AC voltage.

8. The amplitude normalization circuit of claim 1, further comprising an attenuator which attenuates the full-wave rectified voltage.

9. The amplitude normalization circuit of claim 8, wherein an attenuation factor of the attenuator is equal to 1.

10. A power supply comprising an amplitude normalization circuit the amplitude normalization circuit including:
 a peak detector configured to detect a peak value of a full-wave rectified voltage of an AC voltage;
 a triangular wave oscillator connected to the peak detector, configured to generate a triangular wave voltage having a peak based on the peak value of the full-wave rectified voltage;
 a comparator connected to the triangular wave oscillator, configured to compare the triangular wave voltage with the full-wave rectified voltage and output a pulse width modulation signal; and
 a waveform converter connected to the comparator, configured to convert a waveform of the pulse width modulation signal and output an output voltage with a constant amplitude,
 wherein the waveform converter includes:
  a level shifter configured to shift a level of the pulse width modulation signal; and
  a low pass filter connected to the level shifter, configured to filter the level-shifted pulse width modulation signal.

11. A power supply comprising:
 a diode bridge connected to an AC voltage;
 an inductance connected to an AC line via a load;
 a current sense resistor connected to a ground potential;
 a MOSFET connected in series between the inductance and the current sense resistor;
 an amplitude normalization circuit including:
  a peak detector configured to detect a peak value of a full-wave rectified voltage of an AC voltage;
  a triangular wave oscillator connected to the peak detector, configured to generate a triangular wave voltage having a peak based on the peak value of the full-wave rectified voltage;
  a comparator connected to the triangular wave oscillator, configured to compare the triangular wave voltage with the full-wave rectified voltage and output a pulse width modulation signal; and
  a waveform converter connected to the comparator, configured to convert a waveform of the pulse width modulation signal and output an output voltage with a constant amplitude; and
 a PFC controller connected to the MOSFET and the current sense resistor, and corrects a power factor of a current flowing into the load,
 wherein the waveform converter includes:
  a level shifter configured to shift a level of the pulse width modulation signal; and
  a low pass filter connected to the level shifter, configured to filter the level-shifted pulse width modulation signal.

12. The power supply of claim 11, wherein the PFC controller includes:
 a pulse width modulation signal generator;
 an error amplifier having a positive input terminal connected to the current sense resistor and a negative input terminal connected to an output of the amplitude normalization circuit;

a RS flip-flop connected to an output of the pulse width modulation signal generator and an output of the error amplifier, configured to output a PWM control signal for the MOSFET; and a buffer connected to an output of the RS flip-flop, configured to drive the MOSFET.

13. The power supply of claim 12, wherein the MOSFET is turned on at a set operation timing of the RS flip-flop and is turned off at a reset operation timing of the RS flip-flop.

14. The power supply of claim 11, wherein the power supply is one of a PFC step-down LED lighting device, a PFC step-up LED lighting device and a PFC flyback LED lighting device.

15. An electronic apparatus comprising a power supply including an amplitude normalization circuit, the amplitude normalization circuit including:

a peak detector configured to detect a peak value of a full-wave rectified voltage of an AC voltage;

a triangular wave oscillator connected to the peak detector, configured to generate a triangular wave voltage having a peak based on the peak value of the full-wave rectified voltage;

a comparator connected to the triangular wave oscillator, configured to compare the triangular wave voltage with the full-wave rectified voltage and output a pulse width modulation signal; and a waveform converter connected to the comparator, configured to convert a waveform of the pulse width modulation signal and output an output voltage with a constant amplitude, wherein the waveform converter includes:

a level shifter configured to shift a level of the pulse width modulation signal; and a low pass filter connected to the level shifter, configured to filter the level-shifted pulse width modulation signal.

16. An electronic apparatus comprising a power supply, the power supply including:

a diode bridge connected to an AC voltage;

an inductance connected to an AC line via a load;

a current sense resistor connected to a ground potential;

a MOSFET connected in series between the inductance and the current sense resistor;

an amplitude normalization circuit including:

a peak detector configured to detect a peak value of a full-wave rectified voltage of an AC voltage;

a triangular wave oscillator connected to the peak detector, configured to generate a triangular wave voltage having a peak based on the peak value of the full-wave rectified voltage;

a comparator connected to the triangular wave oscillator, configured to compare the triangular wave voltage with the full-wave rectified voltage and output a pulse width modulation signal; and a waveform converter connected to the comparator, configured to convert a waveform of the pulse width modulation signal and output an output voltage with a constant amplitude; and a PFC controller connected to the MOSFET and the current sense resistor, and corrects a power factor of a current flowing into the load, wherein the waveform converter includes:

a level shifter configured to shift a level of the pulse width modulation signal; and a low pass filter connected to the level shifter, configured to filter the level-shifted pulse width modulation signal.

17. The electronic apparatus of claim 15, wherein the electronic apparatus is one of a monitor, an external hard disk drive, a set-top box, a laptop PC, a tablet PC, a smartphone, a battery charging system, a personal computer, a display, a printer, a vacuum cleaner, a refrigerator, a facsimile, a telephone, a communication terminal and a server.

18. The electronic apparatus of claim 16, wherein the electronic apparatus is one of a monitor, an external hard disk drive, a set-top box, a laptop PC, a tablet PC, a smartphone, a battery charging system, a personal computer, a display, a printer, a vacuum cleaner, a refrigerator, a facsimile, a telephone, a communication terminal and a server.

* * * * *